United States Patent
Chen et al.

(10) Patent No.: US 11,798,859 B2
(45) Date of Patent: Oct. 24, 2023

(54) ELECTRONIC DEVICE PACKAGE AND METHOD OF MANUFACTURING THE SAME

(71) Applicant: Advanced Semiconductor Engineering, Inc., Kaohsiung (TW)

(72) Inventors: Chia-Pin Chen, Kaohsiung (TW); Chia-Sheng Tien, Kaohsiung (TW); Wan-Ting Chiu, Kaohsiung (TW); Chi Long Tsai, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 148 days.

(21) Appl. No.: 17/317,762

(22) Filed: May 11, 2021

(65) Prior Publication Data

US 2022/0367306 A1 Nov. 17, 2022

(51) Int. Cl.
*H01L 23/31* (2006.01)
*H01L 23/00* (2006.01)
(Continued)

(52) U.S. Cl.
CPC ...... *H01L 23/3135* (2013.01); *H01L 23/3128* (2013.01); *H01L 23/49816* (2013.01); *H01L 24/24* (2013.01); *H01L 24/25* (2013.01); *H01L 24/73* (2013.01); *H01L 24/92* (2013.01); *H01L 25/0657* (2013.01); *H01L 25/18* (2013.01); *H01L 2224/24146* (2013.01); *H01L 2224/24175* (2013.01); *H01L 2224/24265* (2013.01); *H01L 2224/25171* (2013.01); *H01L 2224/73267* (2013.01); *H01L 2224/92244* (2013.01);
(Continued)

(58) Field of Classification Search
CPC . H10B 80/00; H01L 23/3135; H01L 23/3128; H01L 23/49816; H01L 24/24; H01L 24/25; H01L 24/73; H01L 24/92; H01L 25/0657; H01L 25/18; H10K 19/00; H10K 39/10; H10K 59/90; H10K 59/95; H10K 65/00; H10N 19/00; H10N 39/00; H10N 59/00; H10N 69/00; H10N 79/00; H10N 89/00
See application file for complete search history.

(56) References Cited

U.S. PATENT DOCUMENTS 9,087,832 B2 7/2015 Huang et al.
10,269,778 B2 4/2019 Lin et al.
(Continued)

*Primary Examiner* — Jasmine J Clark
(74) *Attorney, Agent, or Firm* — FOLEY & LARDNER LLP

(57) ABSTRACT

An electronic device package includes an encapsulated electronic component, a substrate, a conductor and a buffer layer. The encapsulated electronic component includes a redistribution layer (RDL) and an encapsulation layer. The first surface is closer to the RDL than the second surface is. The encapsulation layer includes a first surface, and a second surface opposite to the first surface. The substrate is disposed on the second surface of the encapsulation layer. The conductor is disposed between the substrate and the encapsulated electronic component, and electrically connecting the substrate to the encapsulated electronic component. The buffer layer is disposed between the substrate and the encapsulated electronic component and around the conductor.

15 Claims, 36 Drawing Sheets

(51) Int. Cl.
*H01L 23/498* (2006.01)
*H01L 25/18* (2023.01)
*H01L 25/065* (2023.01)

(52) U.S. Cl.
CPC ............... *H01L 2225/06517* (2013.01); *H01L 2225/06524* (2013.01); *H01L 2225/06548* (2013.01); *H01L 2225/06572* (2013.01)

(56) References Cited

U.S. PATENT DOCUMENTS 10,658,333 B2 * 5/2020 Chen ................. H01L 23/49816
2014/0327145 A9 * 11/2014 Pagaila ............. H01L 23/49827
257/774

* cited by examiner

ELECTRONIC DEVICE PACKAGE AND METHOD OF MANUFACTURING THE SAME

TECHNICAL FIELD

The present disclosure generally relates to an electronic device package and method of manufacturing the same, and more particularly, to an electronic device package including a stack of an RDL, an encapsulated electronic component and a circuit substrate, and method of manufacturing the same.

BACKGROUND

In an electronic device package, electrical communication among different electronic components such as application die (AP die), memory die and passive device die are implemented through multiple redistribution layers (RDLs). Different RDLs, however, may have different circuit layers. Also, some RDL(s) is formed prior to the die(s) is encapsulated, while other RDL(s) is formed subsequent to the die(s) is encapsulated. The stack of the RDLs of different circuit layers and the encapsulation layer normally results in warpage issue due to CTE mismatch of the RDLS and the encapsulation layer. Accordingly, the yield and reliability of a conventional electronic device package is deteriorated.

SUMMARY

In some embodiments, an electronic device package includes an encapsulated electronic component, a substrate, a conductor and a buffer layer. The encapsulated electronic component includes a redistribution layer (RDL) and an encapsulation layer. The first surface is closer to the RDL than the second surface is. The encapsulation layer includes a first surface, and a second surface opposite to the first surface. The substrate is disposed on the second surface of the encapsulation layer. The conductor is disposed between the substrate and the encapsulated electronic component, and electrically connecting the substrate to the encapsulated electronic component. The buffer layer is disposed between the substrate and the encapsulated electronic component and around the conductor.

In some embodiments, an electronic device package includes an encapsulated electronic component and a circuit substrate. The encapsulated electronic component includes an RDL, and an encapsulation layer. The encapsulation layer includes a first surface, and a second surface opposite to the first surface. The first surface is closer to the RDL than the second surface is. The circuit substrate is disposed on the second surface of the encapsulation layer. A width of the circuit substrate is smaller than a width of the encapsulated electronic component.

In some embodiments, a method of manufacturing an electronic device package includes reconstructing first dies on a carrier, and encapsulating the first dies to form an encapsulated wafer. The method further includes forming an RDL on a first surface of the encapsulated wafer, bonding a circuit layer on a second surface, which is opposite to the first surface, of the encapsulated wafer, and bonding a second die on the circuit layer.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

DETAILED DESCRIPTION

Figure 1:
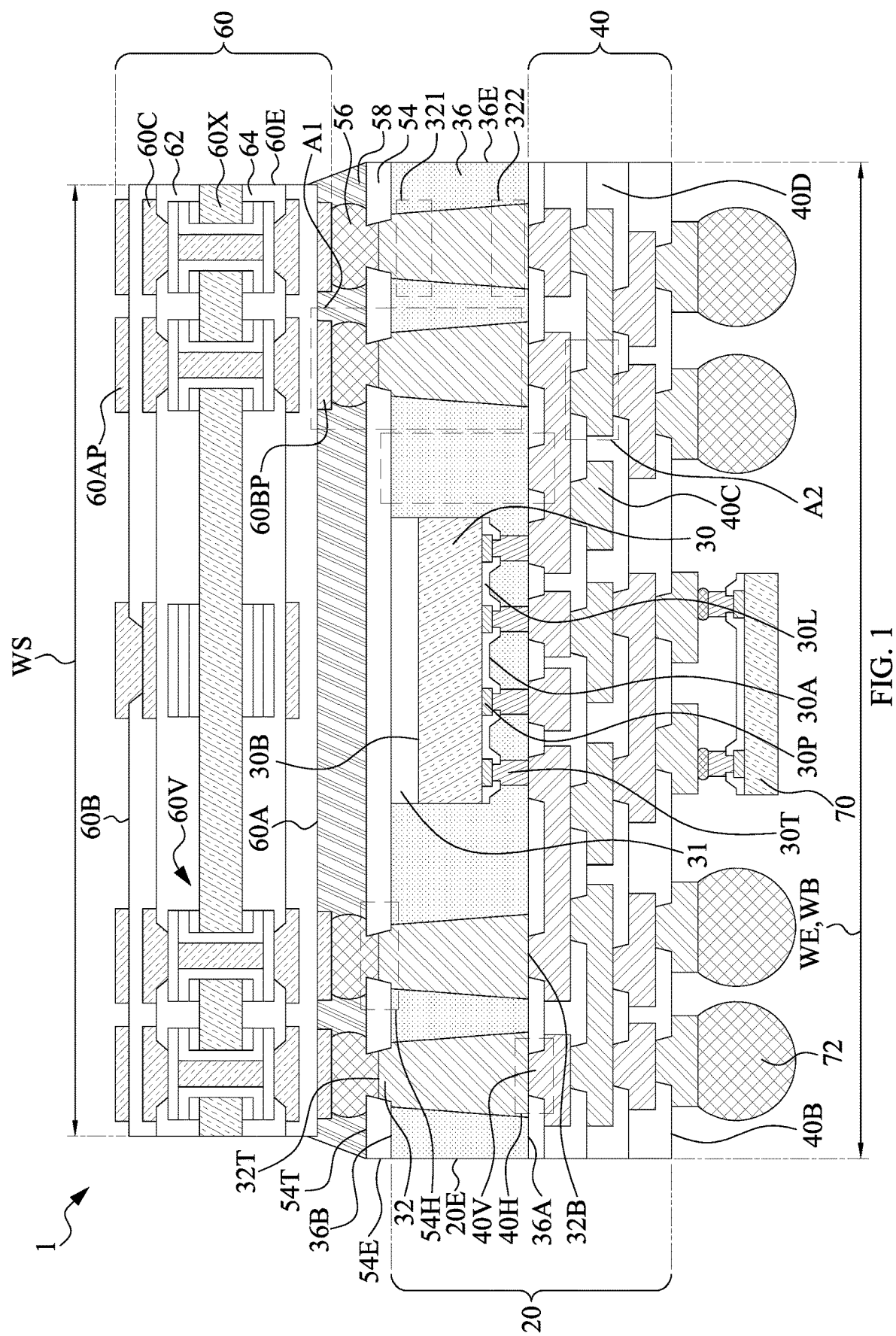
FIG. 1 is a schematic cross-sectional view of an electronic device package in accordance with some arrangements of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Some embodiments, or examples, illustrated in the figures are disclosed below using specific language. It will nevertheless be understood that the embodiments and examples are not intended to be limiting. Any alterations and modifications of some of the disclosed embodiments, and any further applications of the principles disclosed in this document, as would normally occur to one of ordinary skill in the pertinent art, fall within the scope of this disclosure.

Further, it is understood that several processing steps (e.g., operations) and/or features of a device may be briefly described. Also, additional processing steps and/or features can be added, and certain of the processing steps and/or features described herein can be removed or changed while implementing the methods described herein or while using the systems and devices described herein. Thus, the following description should be understood to represent examples, and are not intended to suggest that one or more steps or features are required for every implementation. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein the term "active surface" may refer to a surface of a semiconductor die on which electrical terminals such as contact pads, conductive studs or conductive pillars are disposed, and the term "inactive surface" may refer to another surface of the semiconductor die opposite to the active surface on which no contact terminals are disposed.

Figure 1A:
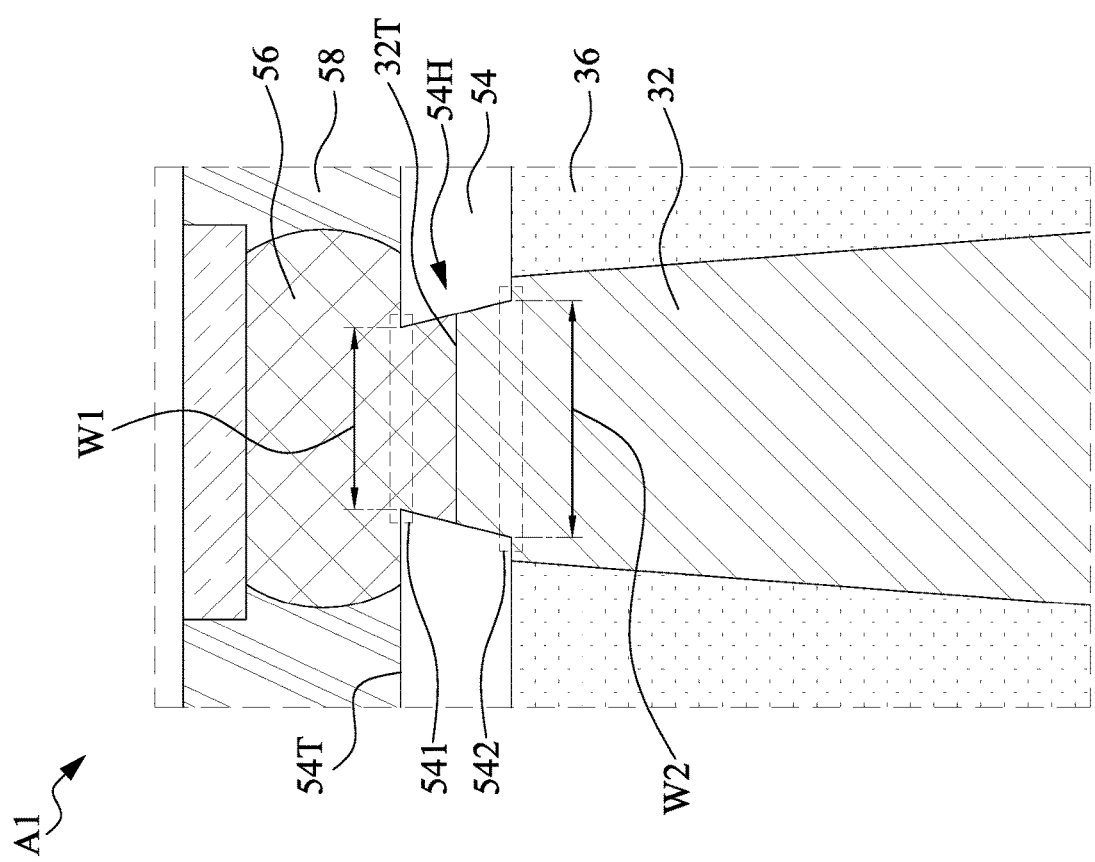
FIG. 1A is a schematic partial enlarge view of region A1 and region A2 of the electronic device package of FIG. 1.
Figure 1B:
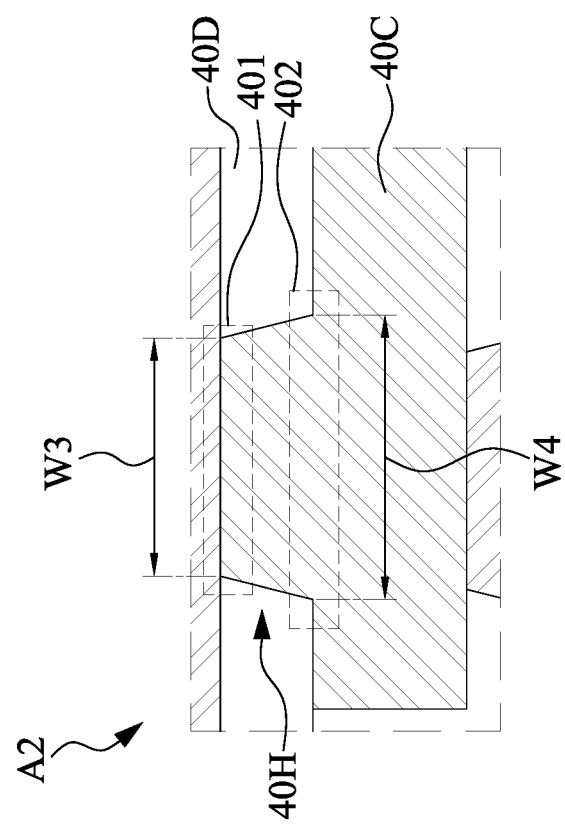
FIG. 1B is a schematic partial enlarge view of region A2 of the electronic device package of FIG. 1.
Figure 1C:
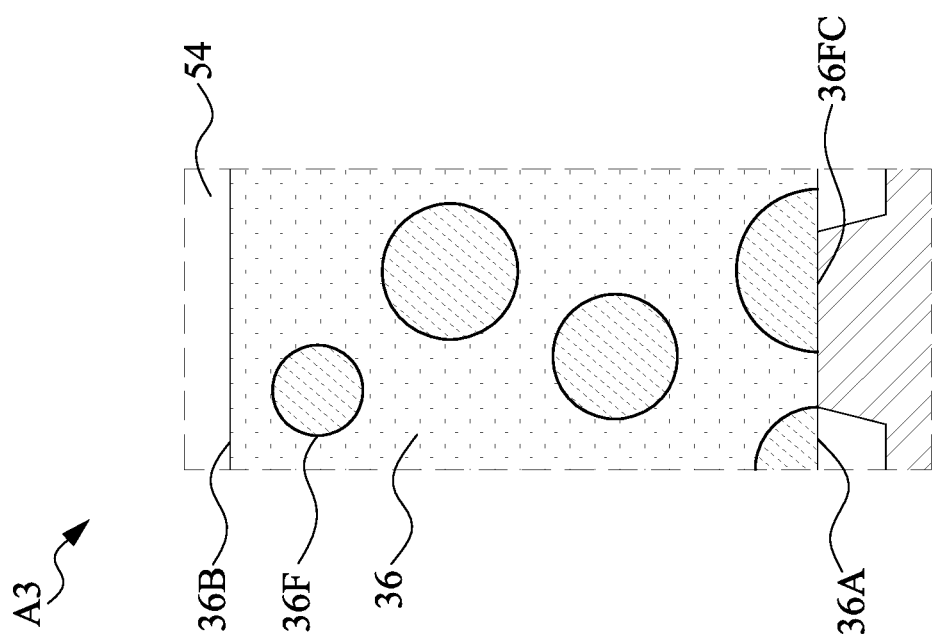
FIG. 1C is a schematic partial enlarge view of region A3 of the electronic device package of FIG. 1.

FIG. 1 is a schematic cross-sectional view of an electronic device package 1 in accordance with some arrangements of the present disclosure, FIG. 1A is a schematic partial enlarge view of region A1 of the electronic device package 1 of FIG. 1, FIG. 1B is a schematic partial enlarge view of region A2 of the electronic device package 1 of FIG. 1, and FIG. 1C is a schematic partial enlarge view of region A3 of the electronic device package 1 of FIG. 1. As shown in FIG. 1, FIG. 1A, FIG. 1B and FIG. 1C, the electronic device package 1 includes an encapsulated electronic component 20, a substrate 60, conductors 56 and a buffer layer 54. The encapsulated electronic component 20 may include a redistribution layer (RDL) 40, a semiconductor die 30 disposed on the RDL 40 and an encapsulation layer 36 disposed on the RDL 40 and encapsulating the semiconductor die 30. The RDL 40 may include one or more circuit layers 40C and one or more dielectric layers 40D alternately stacked on one another. By way of examples, the RDL 40 may include 4 layers of circuit layers 40C and 4 layers of dielectric layers 40D. The semiconductor die 30 may include an active die such as an application specific integrated circuit (ASIC) or any other types of active dies. Alternatively, the semiconductor die 30 may include a passive die or a combination of an active die and a passive die. The encapsulation layer 36 includes a first surface 36A adjacent to the RDL 40, and a second surface 36B opposite to the first surface 36A. The first surface 36A is closer to the RDL 40 than the second surface 36B is. The encapsulation layer 36 may include molding compound such as epoxy-based material (e.g. FR4, electronic molding compounds), resin-based material (e.g. Bismaleimide-Triazine (BT)), ABF, Polyimide (PI) or other suitable molding materials epoxy resin or other suitable encapsulation materials.

The semiconductor die 30 includes an active surface 30A and a back surface 30B opposite to the active surface 30A. In some embodiments, the back surface 30B may be adhered to the buffer layer 54 through a die attach film (DAF) 31. The DAF 31 may be substantially coplanar with the second surface 36B of the encapsulation layer 36. In some embodiments, the semiconductor die 30 includes a plurality of electric terminals 30T exposed from the active surface 30A. The electrical terminals 30T may include conductive studs such as copper studs electrically connected to conductive pads 30P such as UBMs of the semiconductor die 30 exposed by a passivation layer 30L. In some embodiments, the electrical terminals 30T may be substantially coplanar with the first surface 36A of the encapsulation layer 36. In some embodiments, a plurality of fillers 36F such as silicon oxide fillers may be dispensed in the encapsulation layer 36, and at least one of the fillers 36F may include a cutting plane 36FC substantially coplanar with the first surface 36A of the encapsulation layer 36 as shown in FIG. 1C.

In some embodiments, the electronic device package 1 may further include another electronic component 70 such as an active device or a passive device and conductors 72 disposed on a bottom surface 40B of the RDL 40. The electronic component 70 may include a passive device die and electrically connected to the semiconductor die 30 through the RDL 40. The conductors 72 may include, but is not limited to, solder conductors such as solder balls, and configured to connect to a printed circuit board (PCB).

The substrate 60 is disposed on the second surface 36B of the encapsulation layer 36. The substrate 60 includes a first surface 60A adjacent to the second surface 36B of the encapsulation layer 36, a second surface 60B opposite to the first surface 60A, and an edge 60E connecting the first surface 60A and the second surface 60B. The first surface 60A is closer to the second surface 36B of the encapsulation layer 36 than the second surface 60B is. The substrate 60 may include a circuit substrate having embedded circuit layer(s) 60C. In some embodiments, the substrate 60 may include, but is not limited to be, a core substrate. The core substrate includes a core portion 60X, and at least one top dielectric layer 62 and at least one bottom dielectric layer 64 respectively disposed on opposite surfaces of the core portion 60X. The core substrate further includes circuit layers 60C disposed in the top dielectric layer 62 and the bottom dielectric layer 64, and interconnection vias 60V through the core portion 60X and electrically connected to the top dielectric layer 62 and the bottom dielectric layer 64 for vertical connection. The core substrate may include bottom pads 60BP disposed on the second surface 60B, and top pads 60AP disposed on the first surface 60B. The bottom pads 60BP and the top pads 60AP are electrically connected through the circuit layers 60C and the interconnection vias 60V.

The conductors 56 are disposed between the substrate 60 and the encapsulated electronic component 20. By way of example, the conductors 56 are electrically connected to the bottom pads 60BP of the substrate 60. In some embodiments, the conductors 56 may include, but is not limited to, solder conductors such as solder balls, solder bumps or solder pastes. In some embodiments, the top pads 60AP may be further electrically connected to another electronic component such as a memory die.

The substrate 60 and the RDL 40 are different in many aspects such as trace density, line width/spacing (L/S) and/or property. By way of examples, the trace density of the circuit layer 60C of the substrate 60 is lower than the trace density of the circuit layer 40C of the RDL 40. The L/S of the circuit layer 60C of the substrate 60 is larger than the L/S of the circuit layer 40C of the RDL 40. The circuit layer 60C of the substrate 60 may include a rolled and annealed (RA) copper circuit layer, which is manufactured by rolling and annealing operations. The circuit layer 40C of the RDL 40 may include an electroplated copper circuit layer, which is manufactured by electroplating. In some embodiments, the modulus of elasticity of the substrate 60 is different from that of the RDL 40. For example, the modulus of elasticity of the substrate 60 is larger than that of the RDL 40, so as to compensate for warpage.

In some embodiments, the electronic device package 1 may further include an underfill layer 58 disposed between the buffer layer 54 and the substrate 60, and around the conductors 56. The underfill layer 58 may further cover the bottom pads 60BP of the substrate 60. The underfill layer 58 may be in contact with a portion of the edge 60E of the substrate 60. The portion of the underfill layer 58 is lower than the second surface 60B of the substrate 60.

In some embodiments, the width WS of the substrate 60 is smaller than the width WE of the encapsulated electronic component 20. The edge 60E of the substrate 60 and the edge 20E of the encapsulated electronic component 20 are not coplanar. For example, the edge 60E may be recessed from the edge 20E.

The buffer layer 54 is disposed between the substrate 60 and the encapsulated electronic component 20 and around the conductors 56. In some embodiments, the material of the buffer layer 54 may include an organic dielectric layer such as polyimide or the like. The buffer layer 54 may include a photo-cured dielectric material. Alternatively, the material of the buffer layer 54 may include an inorganic dielectric layer. The buffer layer 54 may be at least disposed between the encapsulation layer 36 and the conductors 56.

In some embodiments, the width WB of the buffer layer 54 is substantially equal to the width WE of the encapsulated electronic component 20. The edge 54E of the buffer layer 54 may be substantially coplanar with the edge 20E of the encapsulated electronic component 20.

As shown in FIG. 1A, the buffer layer 54 may include first openings 54H for receiving the conductors 56. Each of the first openings 54H has a first aperture 541 and a second aperture 542 opposite to the first aperture 541. The first aperture 541 is closer to the substrate 60 than the second aperture 542 is. The first aperture 541 has a first width W1, and the second aperture 542 has a second width W2. The second width W2 is larger than the first width W1. In some embodiments, the first opening 54H may include a trapezoid cross-sectional shape. As shown in FIG. 1B, the dielectric layer(s) 40D of the RDL 40 may include second openings 40H and conductive vias 40V disposed in the second openings 40H and electrically connected to the circuit layers 40C. Each of the second openings 40H has a third aperture 401, and a fourth aperture 402 opposite to the third aperture 401. The third aperture 401 is closer to the first surface 36A of the encapsulation layer 36 than the fourth aperture 402 is. The third aperture 401 has a third width W3, and the fourth aperture 402 has a fourth width W4. The fourth width W4 is larger than the third width W3. In some embodiments, the second opening 40H may include a trapezoid cross-sectional shape.

In some embodiments, the encapsulated electronic component 20 further includes conductive pillars 32 disposed in the encapsulation layer 36. The conductive pillar 32 includes a top surface 32T adjacent to the conductor 56, and a bottom surface 32B adjacent to the RDL 40. The top surface 32T is closer than the conductor 56 than the bottom surface 32B is. The top surfaces 32T of the conductive pillars 32 are electrically connected to the conductors 56 respectively, and the top surfaces 32T of the conductive pillars 32 are in the first openings 54H and lower than the top surface 54T of the buffer layer 54. In some embodiments, the conductors 56 may extend into the first openings 54H to connect the top surfaces 32T of the conductive pillars 32. In some embodiments, the conductive pillar 32 includes a top portion 321 near the second surface 36B of the encapsulation layer 36, and a bottom portion 322 near the first surface 36A of the encapsulation layer 36. The bottom portion 322 may be wider than the top portion 321. By way of example, the conductive pillar 32 may include a trapezoid cross-sectional shape.

Figure 1D:
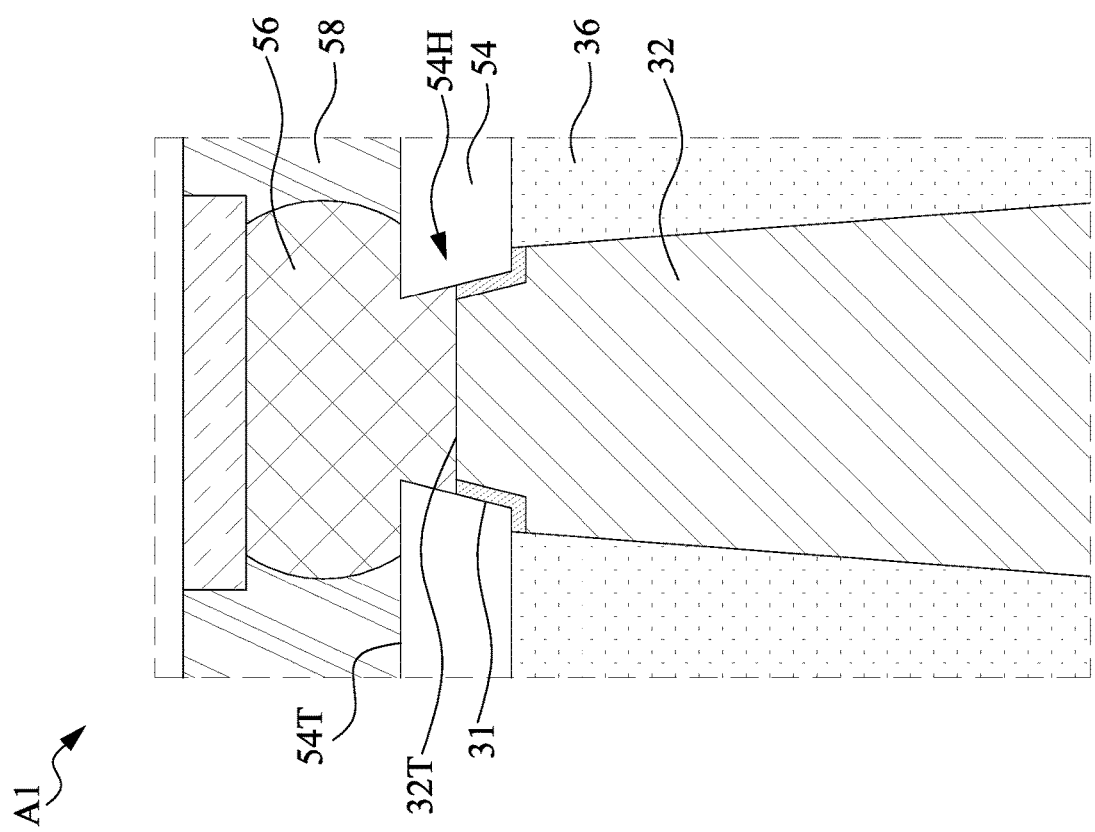
FIG. 1D is a schematic partial enlarge view of region A1 of the electronic device package 1 of FIG. in accordance with some other arrangement of the present disclosure.

FIG. 1D is a schematic partial enlarge view of region A1 of the electronic device package 1 of FIG. 1 in accordance with some other arrangement of the present disclosure. As shown in FIG. 1D, a seed layer 31 may be located between the conductive pillar 32 and the buffer layer 54. Because a portion of the seed layer 31 may be removed by e.g., etching, and the remaining portion of the seed layer 31 may include an L cross-sectional shape. In some embodiments, the seed layer 31 may be substantially coplanar with the top surface 32T of the conductive pillar 32.

Figure 1E:
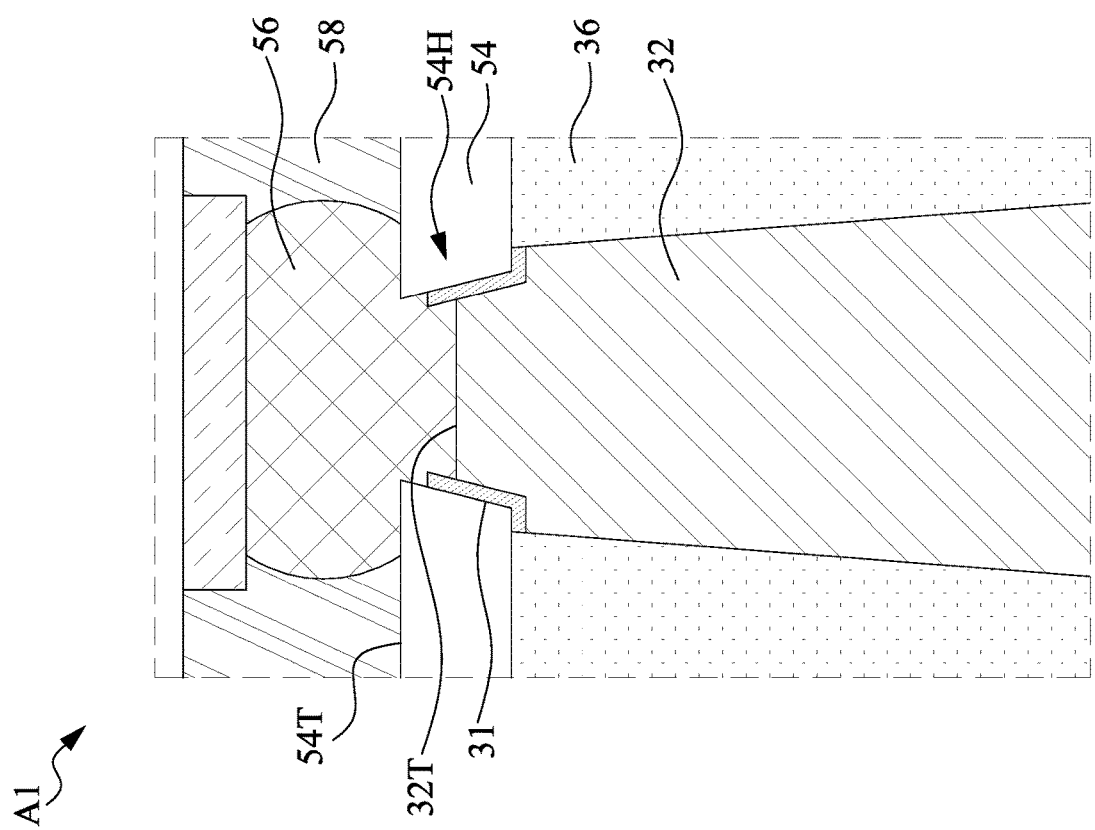
FIG. 1E is a schematic partial enlarge view of region A1 of the electronic device package of FIG. 1 in accordance with some other arrangement of the present disclosure.

FIG. 1E is a schematic partial enlarge view of region A1 of the electronic device package 1 of FIG. 1 in accordance with some other arrangement of the present disclosure. In some embodiments, the seed layer 31 may include a multi-layered seed layer such as a titanium/copper layer. Because the first width W1 of the first aperture 541 is smaller than the second width W2 of the second aperture 542 of the first opening 54H, a portion of the seed layer 31 located on the inner edge of the first opening 54H of the buffer layer 54 is not entirely removed. Accordingly, the remaining portion of the seed layer 31 may further protrude out of the top surface 32T of the conductive pillar 32, and lower than the top surface 54T of the buffer layer 54 as illustrated in FIG. 1E.

Figure 1F:
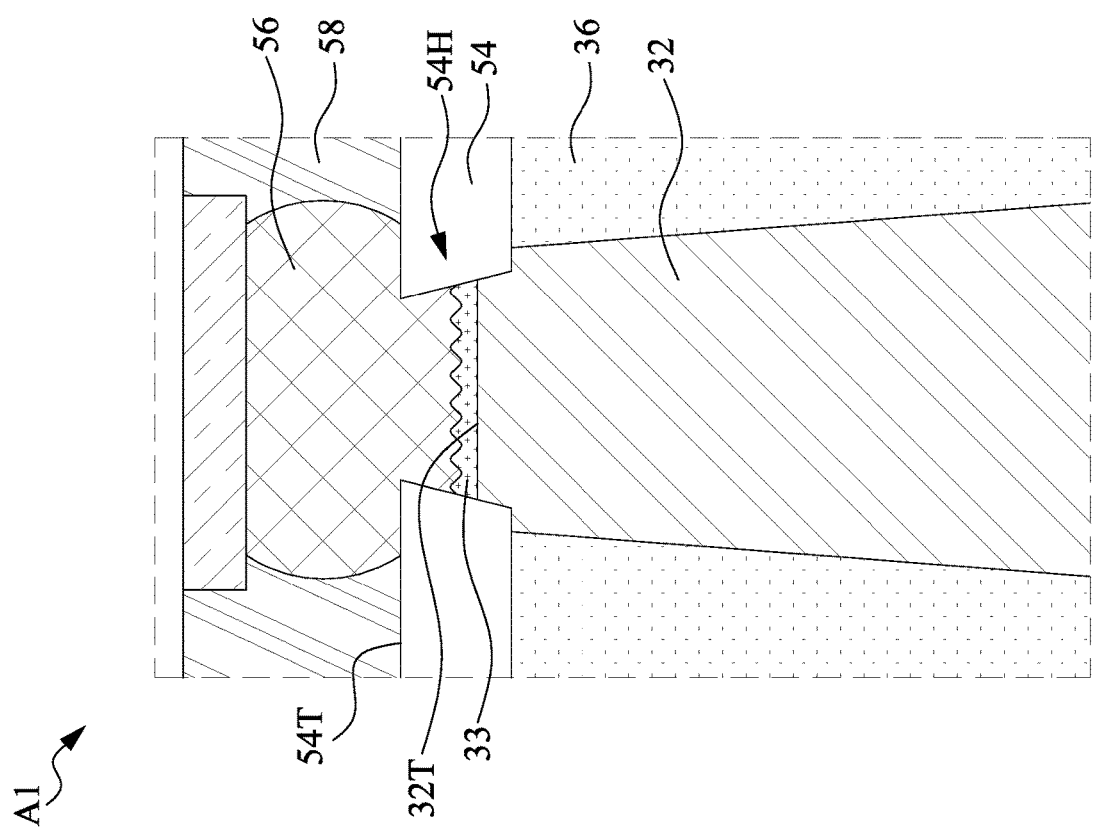
FIG. 1F is a schematic partial enlarge view of region A1 of the electronic device package of FIG. 1 in accordance with some other arrangement of the present disclosure.

FIG. 1F is a schematic partial enlarge view of region A1 of the electronic device package 1 of FIG. 1 in accordance with some other arrangement of the present disclosure. As shown in FIG. 1F, an intermetallic compound (IMC) 33 may be located between the conductive pillar 32 and the conductor 56. The IMC 33 is the intermetallic compound of the material of the conductive pillar 32 such as copper and the material of the conductor 56 such as tin, gold, silver or other solder material. The IMC 33 may include a rough interface with the conductor 56. In some embodiments, the IMC 33 is lower than the top surface 54T of the buffer layer 54.

Figure 1G:
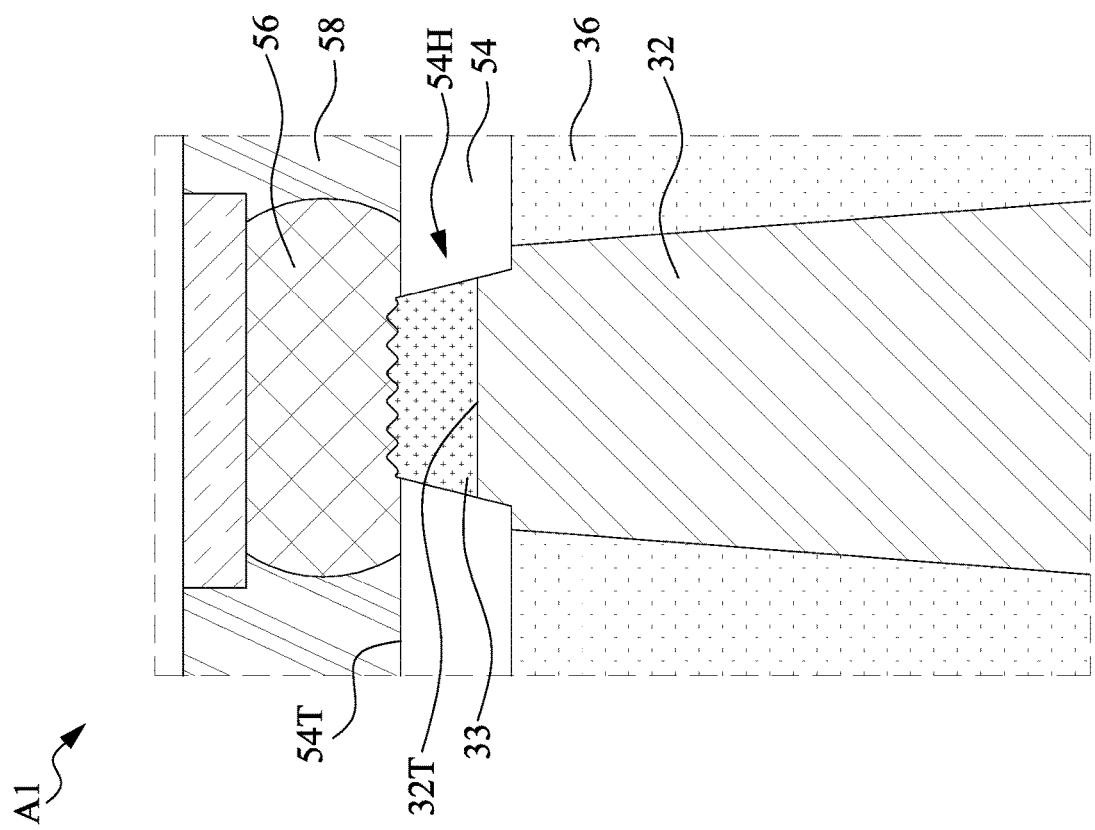
FIG. 1G is a schematic partial enlarge view of region A1 of the electronic device package of FIG. 1 in accordance with some other arrangement of the present disclosure.

FIG. 1G is a schematic partial enlarge view of region A1 of the electronic device package 1 of FIG. 1 in accordance with some other arrangement of the present disclosure. In contrast to FIG. 1F, the IMC 33 is higher than the top surface 54T of the buffer layer 54.

In some embodiments of the present disclosure, the electronic device package 1 includes an RDL 40 and a circuit substrate 60 respectively disposed on opposite surfaces of an encapsulated electronic component 20. The circuit substrate 60 may be further electrically connected to another electronic component such as a memory die or the like. The circuit substrate 60 can be bonded to the encapsulated electronic component 20 instead of building up on the encapsulated electronic component 20, and thus manufacturing costs can be reduced and warpage issue can be minimized.

The electronic device package and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Figure 2:
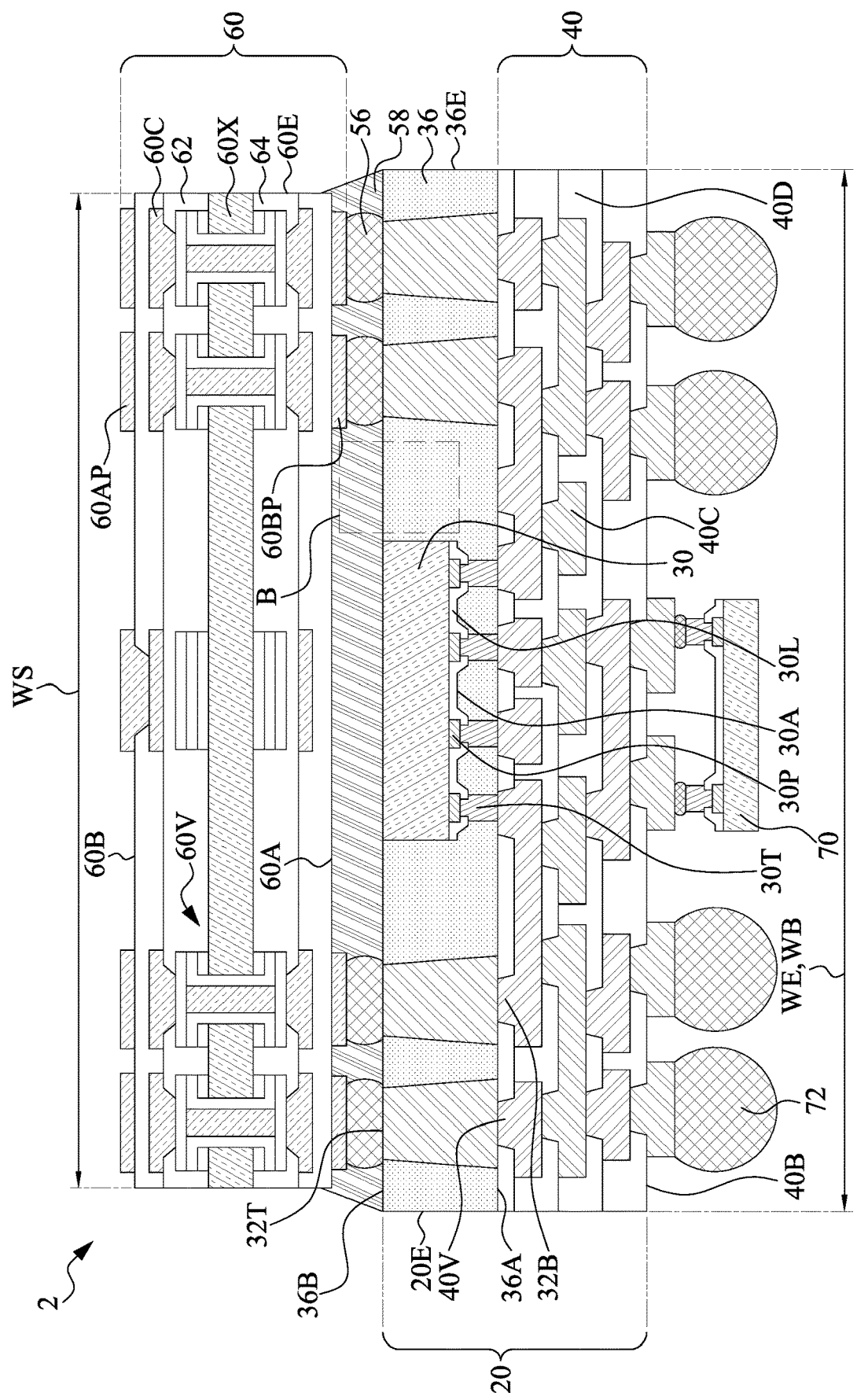
FIG. 2 is a schematic cross-sectional view of an electronic device package in accordance with some arrangements of the present disclosure.
Figure 2A:
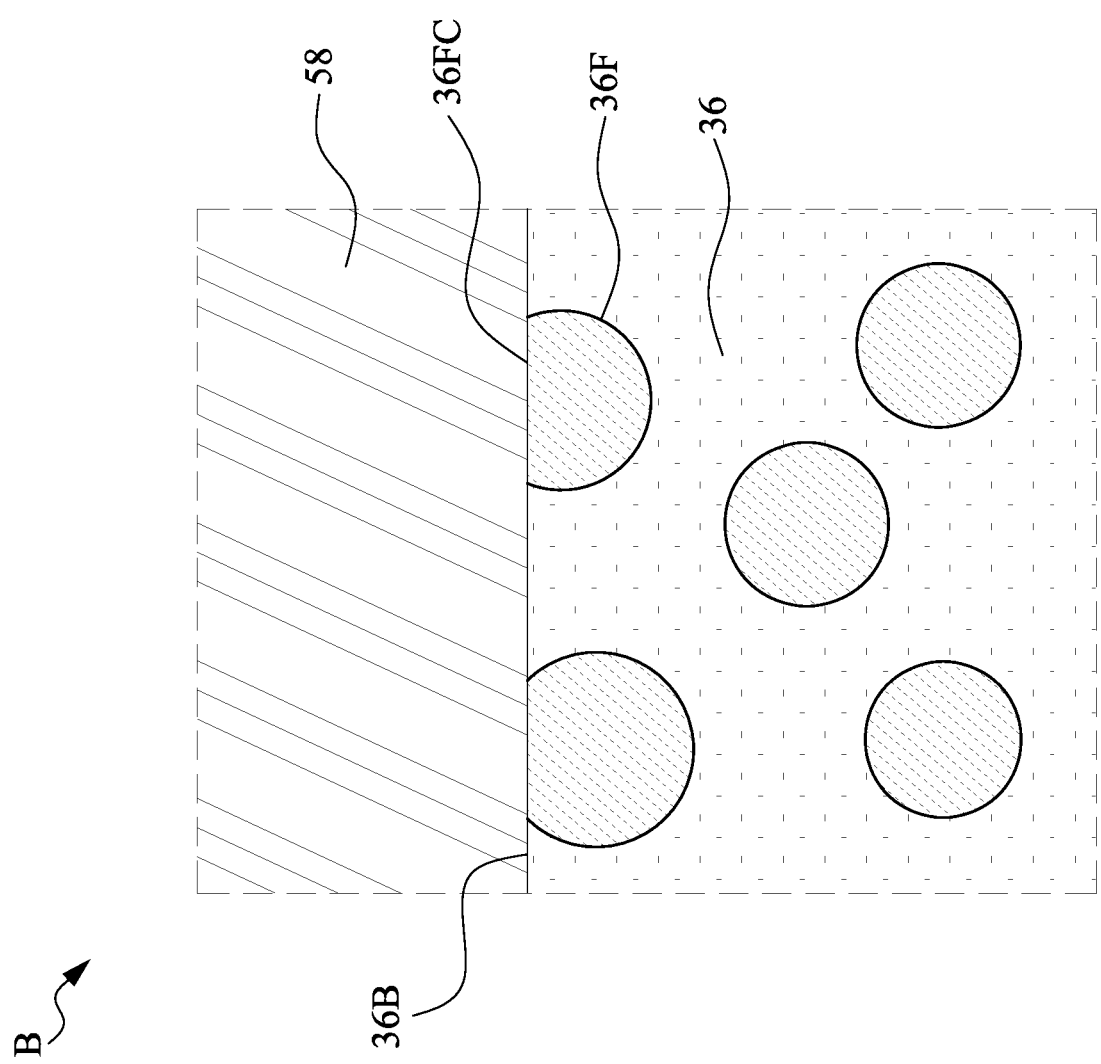
FIG. 2A is a schematic partial enlarge view of region B of the electronic device package of FIG. 2.

FIG. 2 is a schematic cross-sectional view of an electronic device package 2 in accordance with some arrangements of the present disclosure, FIG. 2A is a schematic partial enlarge view of region B of the electronic device package 2 of FIG. 2. As shown in FIG. 2 and FIG. 2A, in contrast to the electronic device package 1, the buffer layer 58 of the electronic device package 2 is omitted. In some embodiments, and the back surface 30B of the semiconductor die 30 is exposed from the second surface 36B of the encapsulation layer 36. A plurality of fillers 36F such as silicon oxide fillers may be dispensed in the encapsulation layer 36, and at least one of the fillers 36F may include a cutting plane 36FC substantially coplanar with the second surface 36B of the encapsulation layer 36 as shown in FIG. 2A. In some embodiments, the back surface 30B of the semiconductor die 30 is in contact with the underfill layer 58 without the DAF 31 being interposed therebetween, which avoids the delamination or bleeding issue between the DAF 31 and the back surface 30B of the semiconductor die 30. Accordingly, the reliability and yield of can be improved.

FIG. 3A, FIG. 3B, FIG. 3C, FIG. 3D, FIG. 3E, FIG. 3F, FIG. 3G, FIG. 3H, FIG. 3I, FIG. 3J and FIG. 3K illustrate operations of manufacturing an electronic device package in accordance with some arrangements of the present disclosure.

Figure 3A:
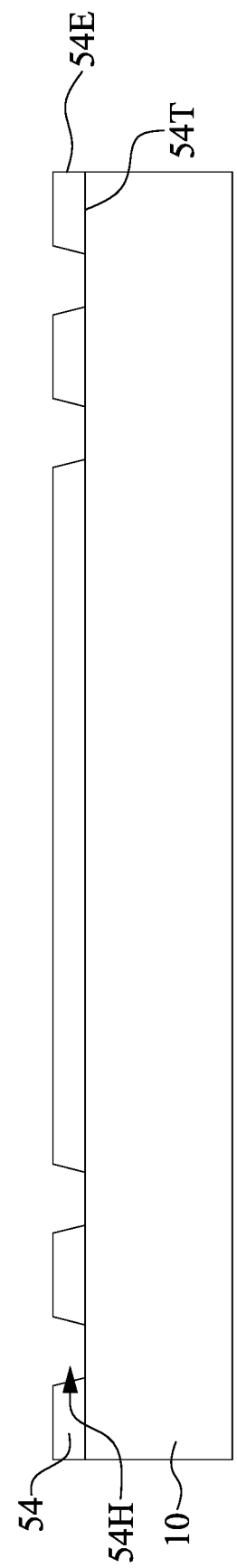
FIG. 3A, FIG. 3B, FIG. 3C, FIG. 3D, FIG. 3E, FIG. 3F, FIG. 3G, FIG. 3H, FIG. 3I, FIG. 3J and FIG. 3K illustrate operations of manufacturing an electronic device package in accordance with some arrangements of the present disclosure.
Figure 3B:
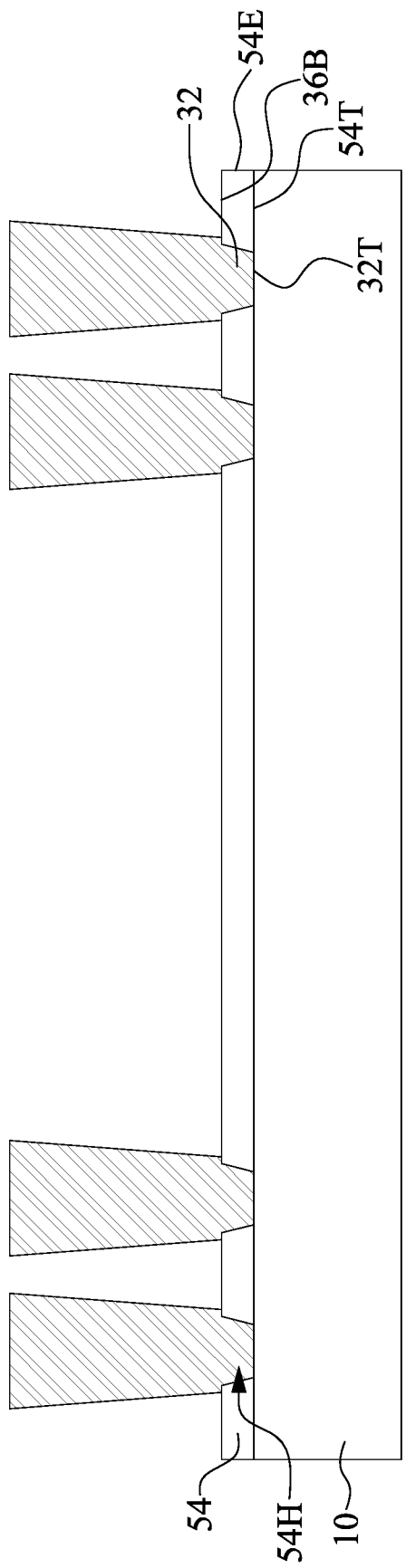
Figure 3C:
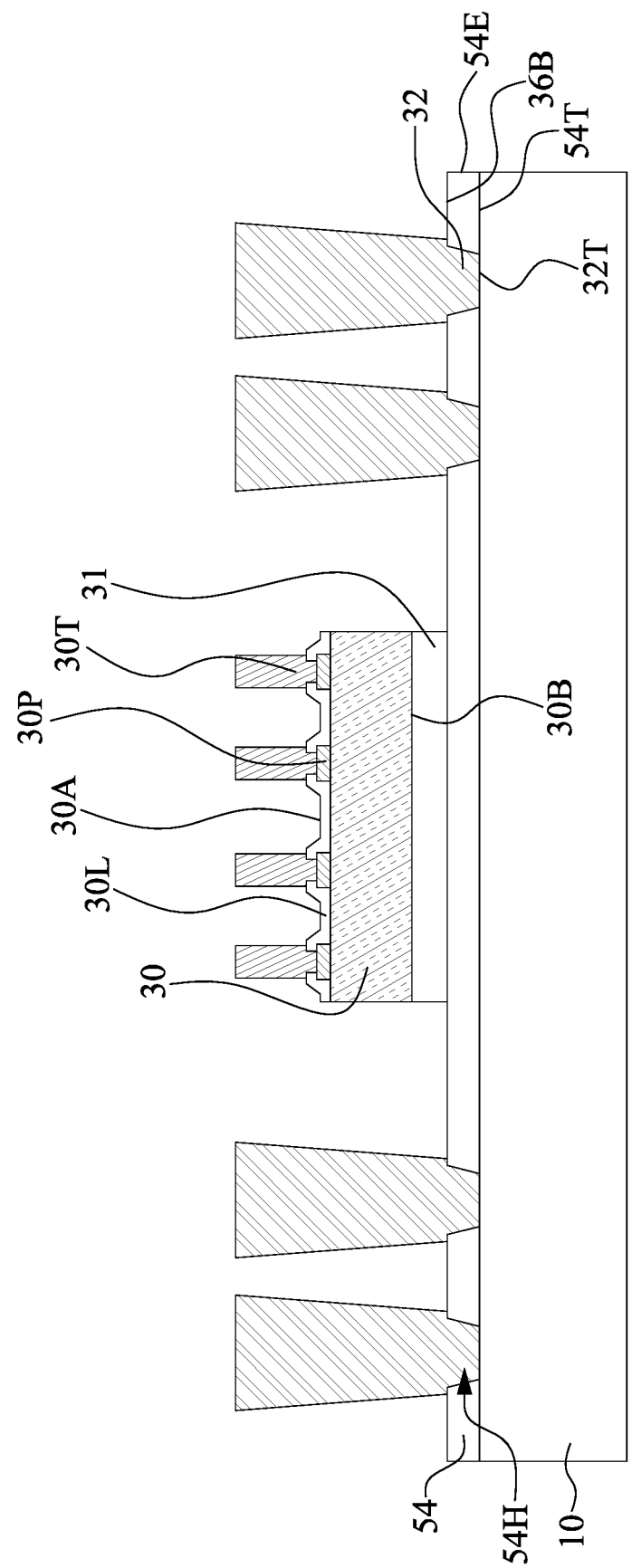

As shown in FIG. 3A, a carrier 10 such as a glass carrier is provided. A buffer layer 54 is formed on the carrier 10, and the buffer layer 54 may be patterned to form first openings 54H. In some embodiments, the buffer layer 54 may include photo sensitive material such as polyimide, and the first openings 54H can be formed by photolithography technique. As shown in FIG. 3B, conductive pillars 32 are formed in the first openings 54H and on the buffer layer 54. In some embodiments, the conductive pillars 32 can be formed by electroplating, and a seed layer (not shown) can be formed for electroplating the conductive pillars 32 before or after the buffer layer 54 is formed. As shown in FIG. 3C, a plurality of first dies (also referred to as semiconductor dies) 30 are reconstructed on the carrier 10, and adhered to the buffer layer 58 by a DAF 31.

Figure 3D:
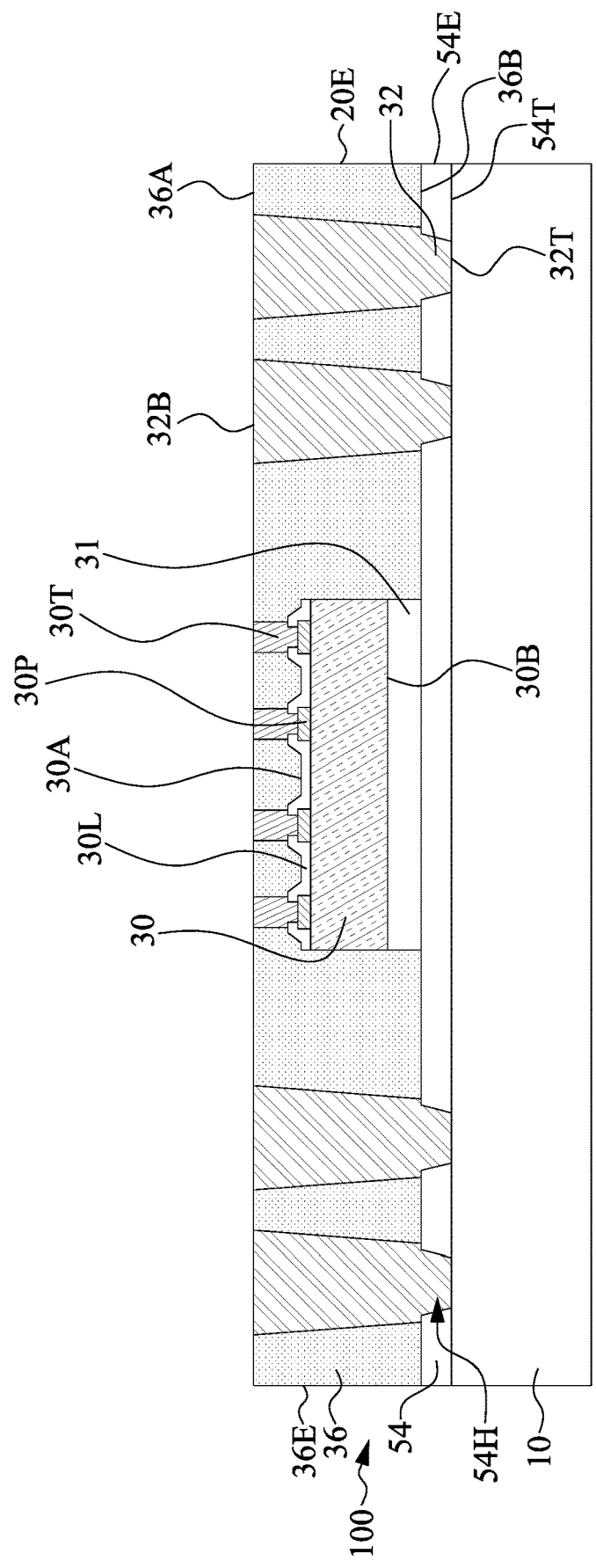

As shown in FIG. 3D, the first dies 30 are encapsulated by an encapsulation layer 36 to form an encapsulated wafer 100. The encapsulation layer 36 is then thinned by e.g., grinding to expose the conductive pillars 32 and the electrical terminals 30T such as conductive studs.

Figure 3E:
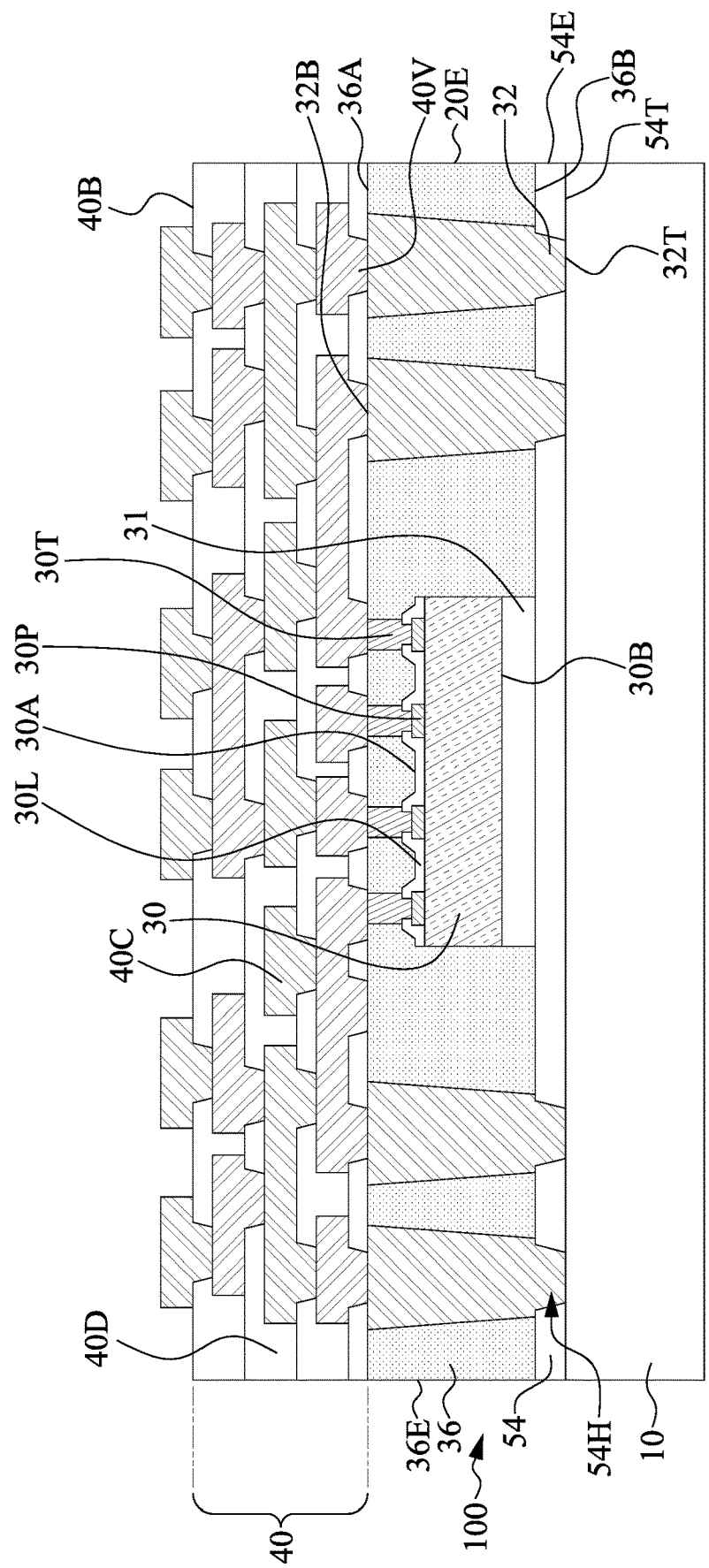
Figure 3F:
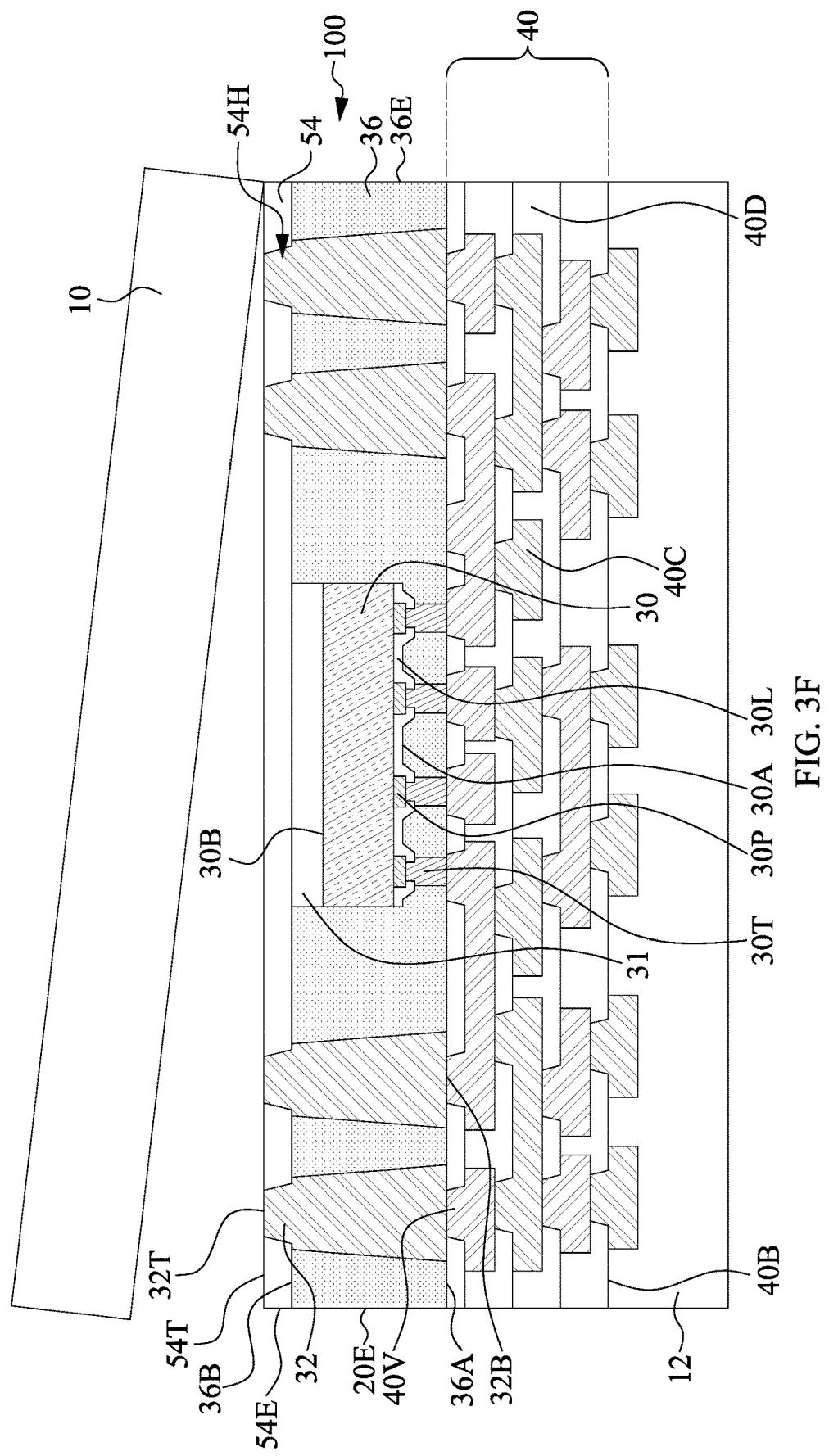
Figure 3G:
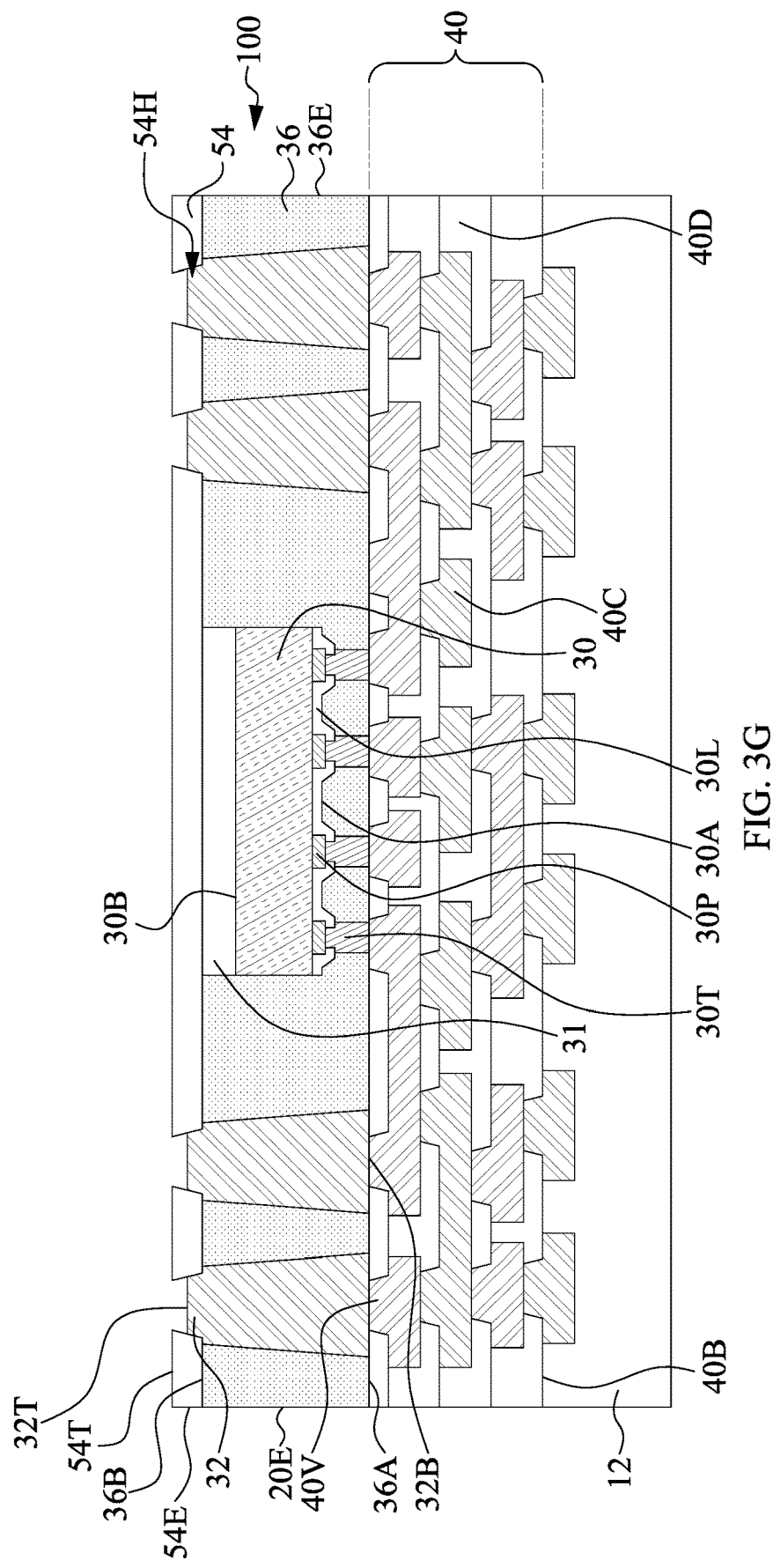
Figure 3H:
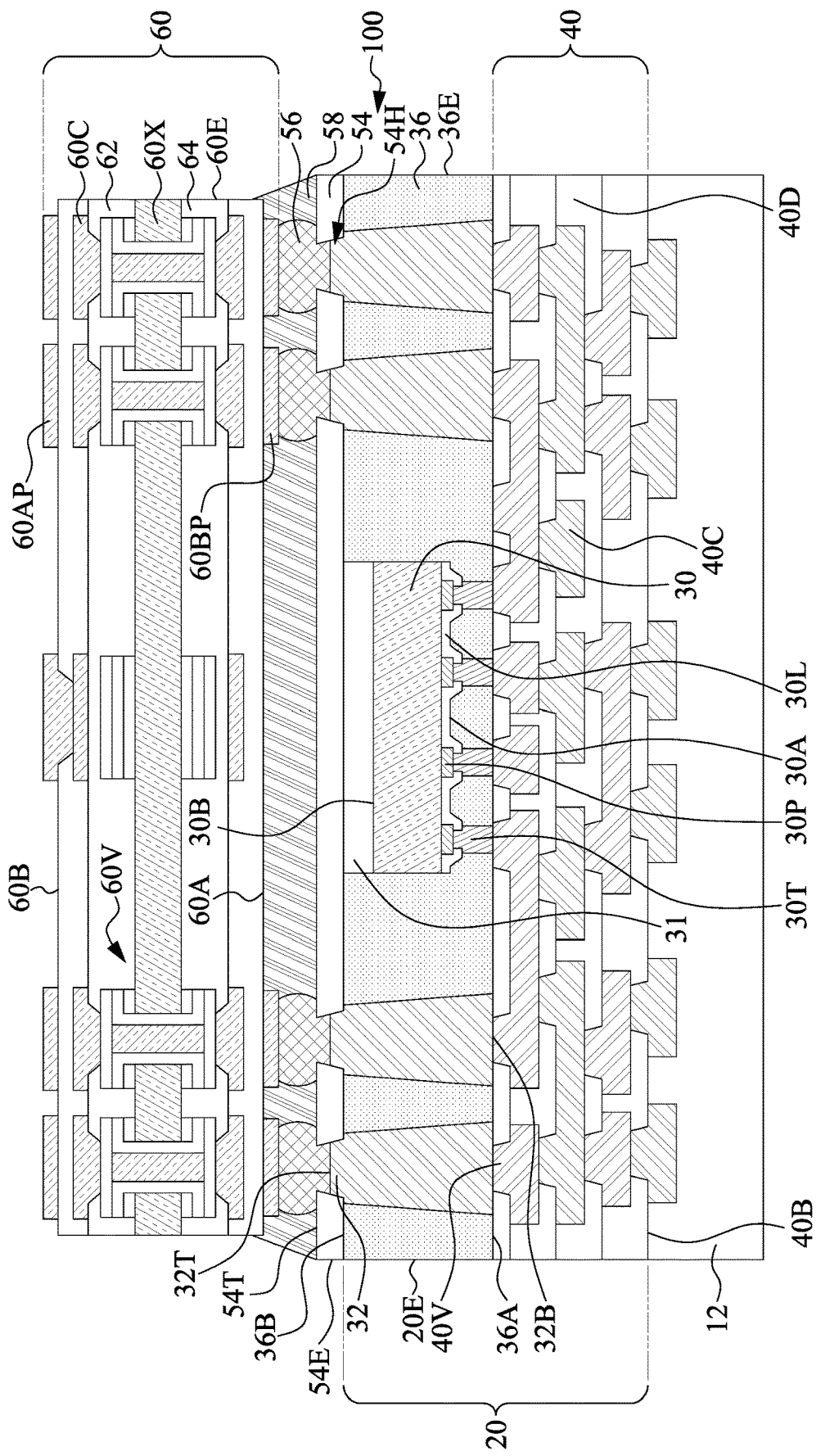

As shown in FIG. 3E, an RDL 40 is formed on a first surface 36A of the encapsulated wafer 100. As shown in FIG. 3F, the RDL 40 is adhered to and supported by another carrier 12 such as a glass carrier, and the carrier 10 is released from the encapsulated wafer 100. As shown in FIG. 3G, a clean process such as a wet etching or a dry etching may be performed to clean the second surface 36B of the encapsulated wafer 100. In some embodiments, a portion of the conductive pillars 32 can be removed in the clean process, such that the top surface 32T is recessed from and lower than the top surface 54T of the buffer layer 54 as illustrated in FIG. 1 and FIG. 1A. In some embodiments, a portion of the seed layer 31 can be removed in the clean process, while another portion of the seed layer 31 can be reserved as illustrated in FIG. 1D. In some embodiments, the etching rate of the conductive pillars 32 and the etching rate of the seed layer 31 may be distinct, and thus the remaining seed layer 31 may protrude out of the top surface 32T of the conductive pillar 32 as illustrated in FIG. 1E. As shown in FIG. 3H, the encapsulated wafer 100 is singulated, and a circuit layer 60 is bonded on a second surface 36B of the encapsulated wafer 100. In some embodiments, the circuit layer 60 may include a circuit substrate such as a core substrate as descried, and is bonded to the conductive pillars 32 through conductors 56. The width of the circuit layer 60 may be smaller than the width of the singulated encapsulated wafer 100. In some embodiments, the conductors 56 and the conductive pillars 32 may react, and an IMC 33 may be produced as illustrated in FIG. 1F or FIG. 1G. In some embodiments, an underfill layer 58 is formed between the circuit layer 60 and the singulated encapsulated wafer 100.

Figure 3I:
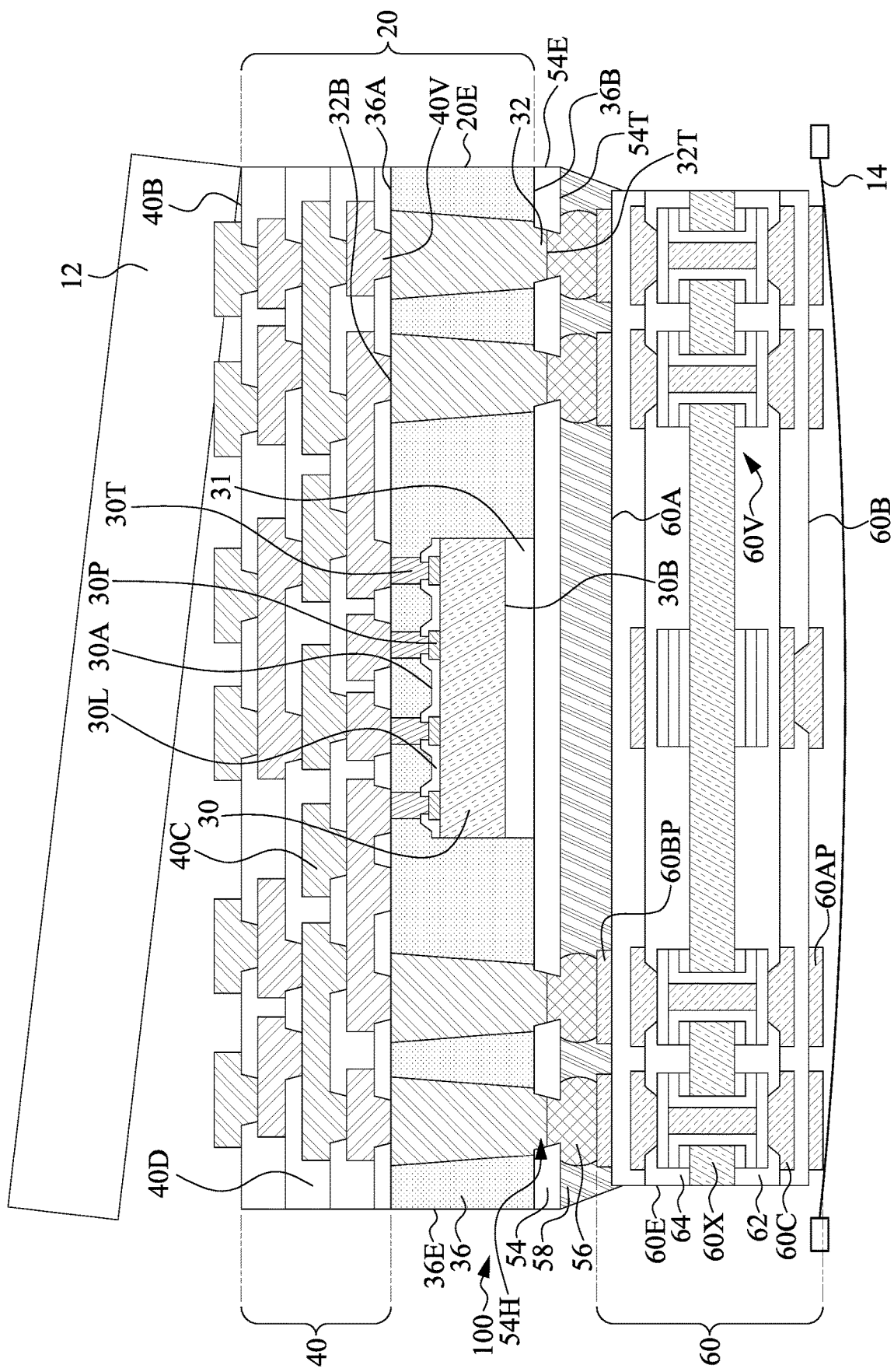
Figure 3J:
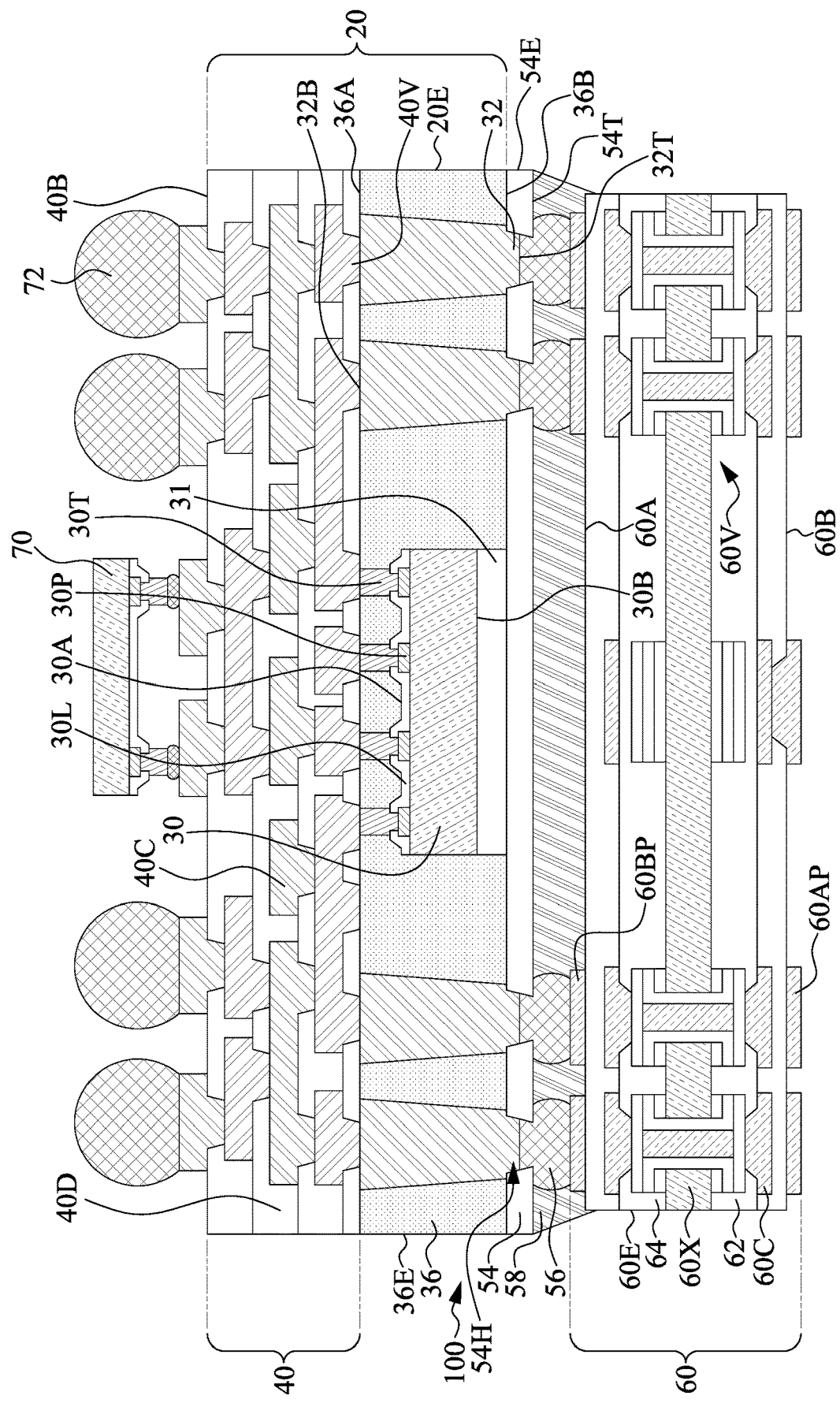
Figure 3K:
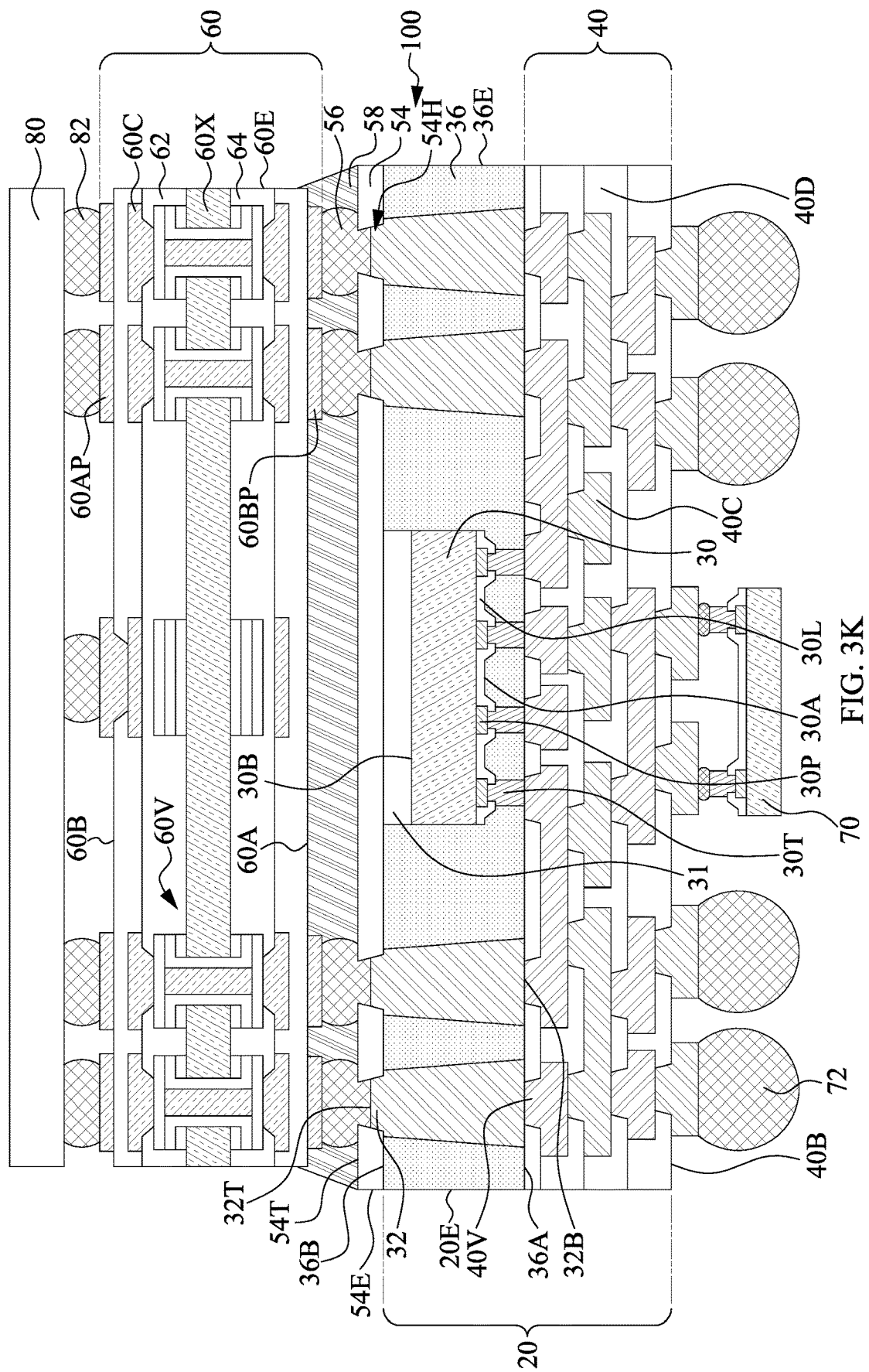

As shown in FIG. 3I, the singulated encapsulated wafer 100 is adhered to and supported by a tape 14, and the carrier 12 is released from the singulated encapsulated wafer 100. As shown in FIG. 3J, another electronic component 70 such as a passive device is bonded on the RDL 40. Conductors 72 such as solder conductors are formed on the RDL 40. As shown in FIG. 3K, a second die 80 such as a memory die is bonded to the circuit layer 60 through conductors 82 such as solder conductors.

FIG. 4A, FIG. 4B, FIG. 4C, FIG. 4D, FIG. 4E and FIG. 4F illustrate operations of manufacturing an electronic device package in accordance with some arrangements of the present disclosure.

Figure 4A:
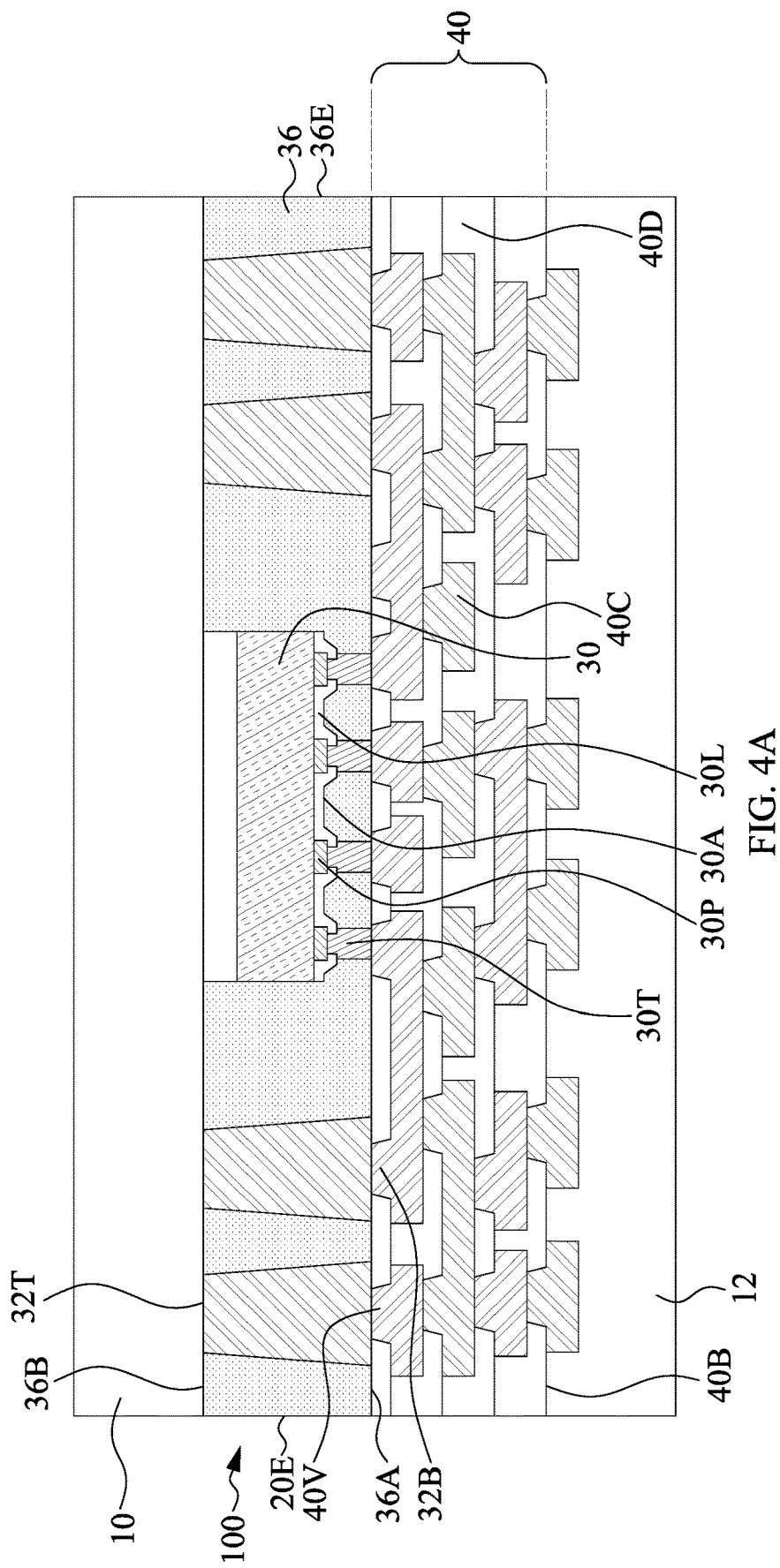
FIG. 4A, FIG. 4B, FIG. 4C, FIG. 4D, FIG. 4E and FIG. 4F illustrate operations of manufacturing an electronic device package in accordance with some arrangements of the present disclosure.

As shown in FIG. 4A, a buffer layer 54 is formed on the carrier 10, and the buffer layer 54 is patterned to form first openings 54H. Conductive pillars 32 are formed in the first openings 54H and on the buffer layer 54. A plurality of first dies (also referred to as semiconductor dies) 30 are reconstructed on the carrier 10, and adhered to the buffer layer 58 by a DAF 31. The first dies 30 are encapsulated by an encapsulation layer 36 to form an encapsulated wafer 100. The encapsulation layer 36 is then thinned by e.g., grinding to expose the conductive pillars 32 and the electrical terminals 30T such as conductive studs. An RDL 40 is formed on a first surface 36A of the encapsulated wafer 100. The RDL 40 is adhered to and supported by another carrier 12.

Figure 4B:
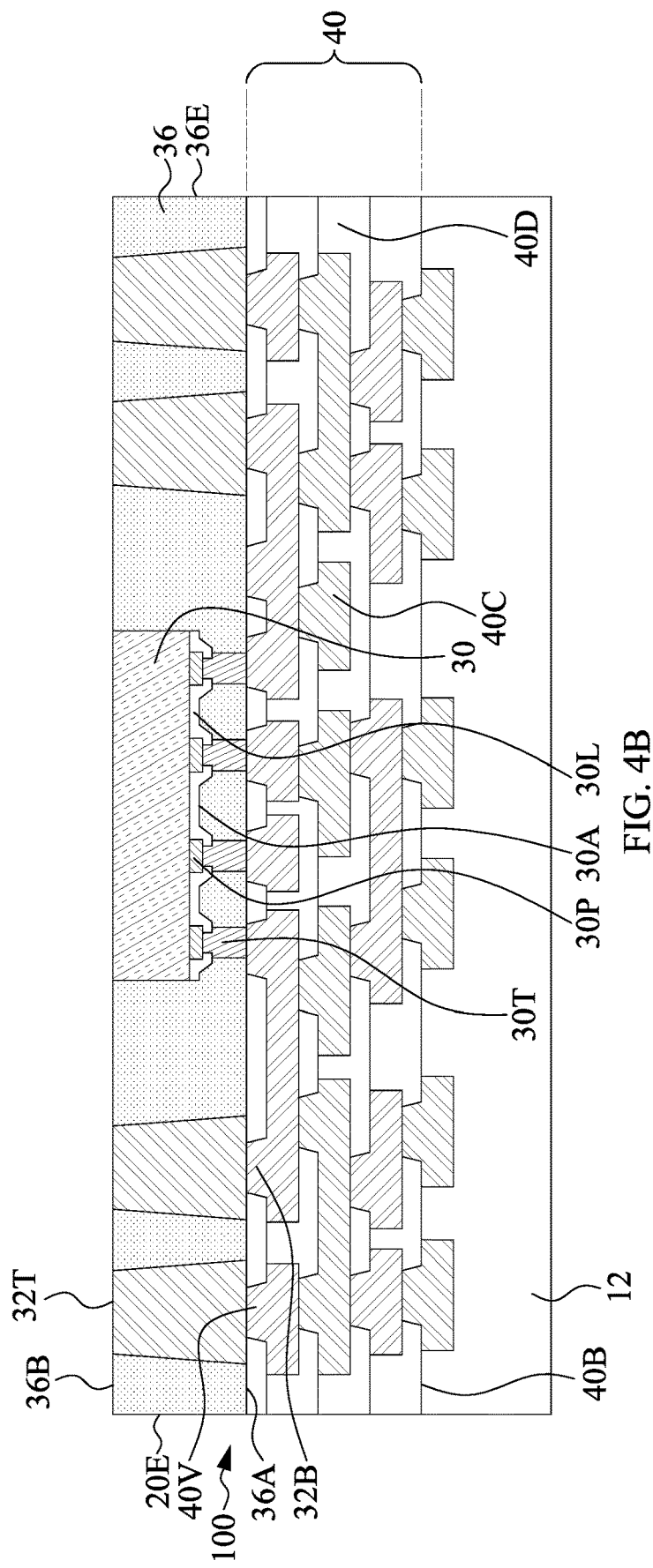

As shown in FIG. 4B, the carrier 10 is released from the encapsulated wafer 100. The buffer layer 54 is removed from the encapsulated wafer 100 by, e.g., grinding. In some embodiments, the DAF 31 and a portion of the encapsulation layer 36 and the conductive pillars 32 in the first openings 54H are removed as well to expose the back surfaces 30B of the first dies 30.

Figure 4C:
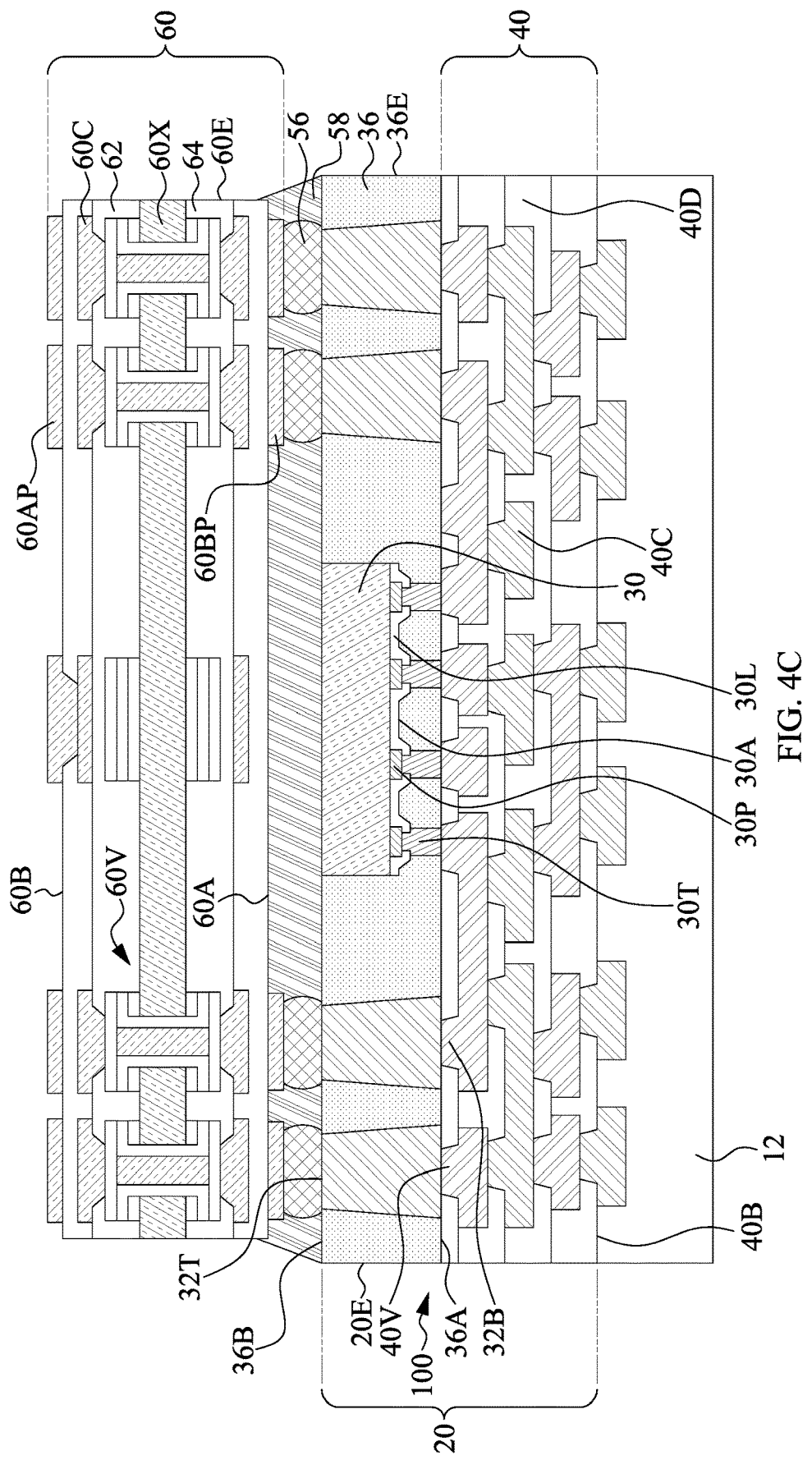
Figure 4D:
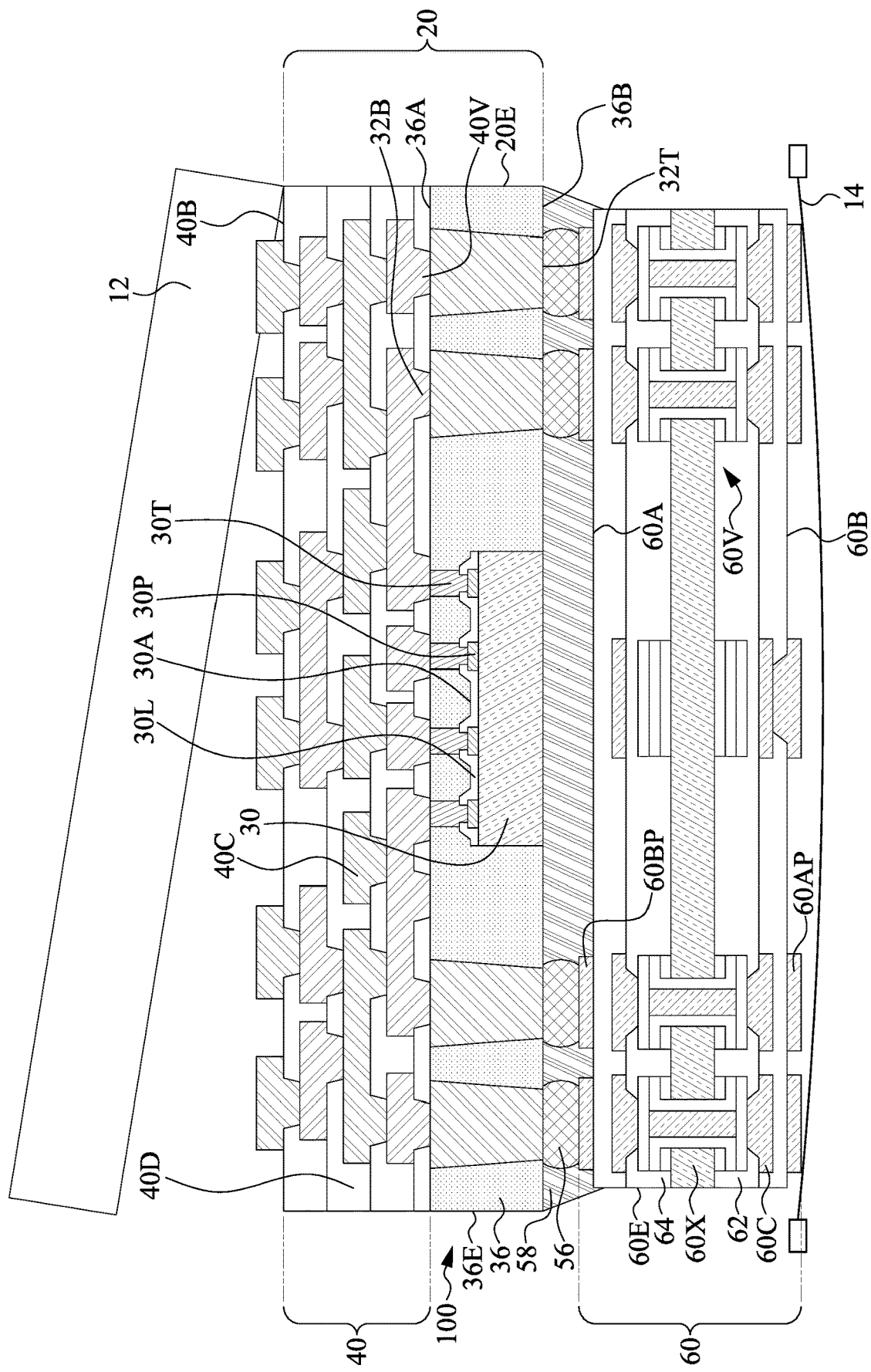
Figure 4E:
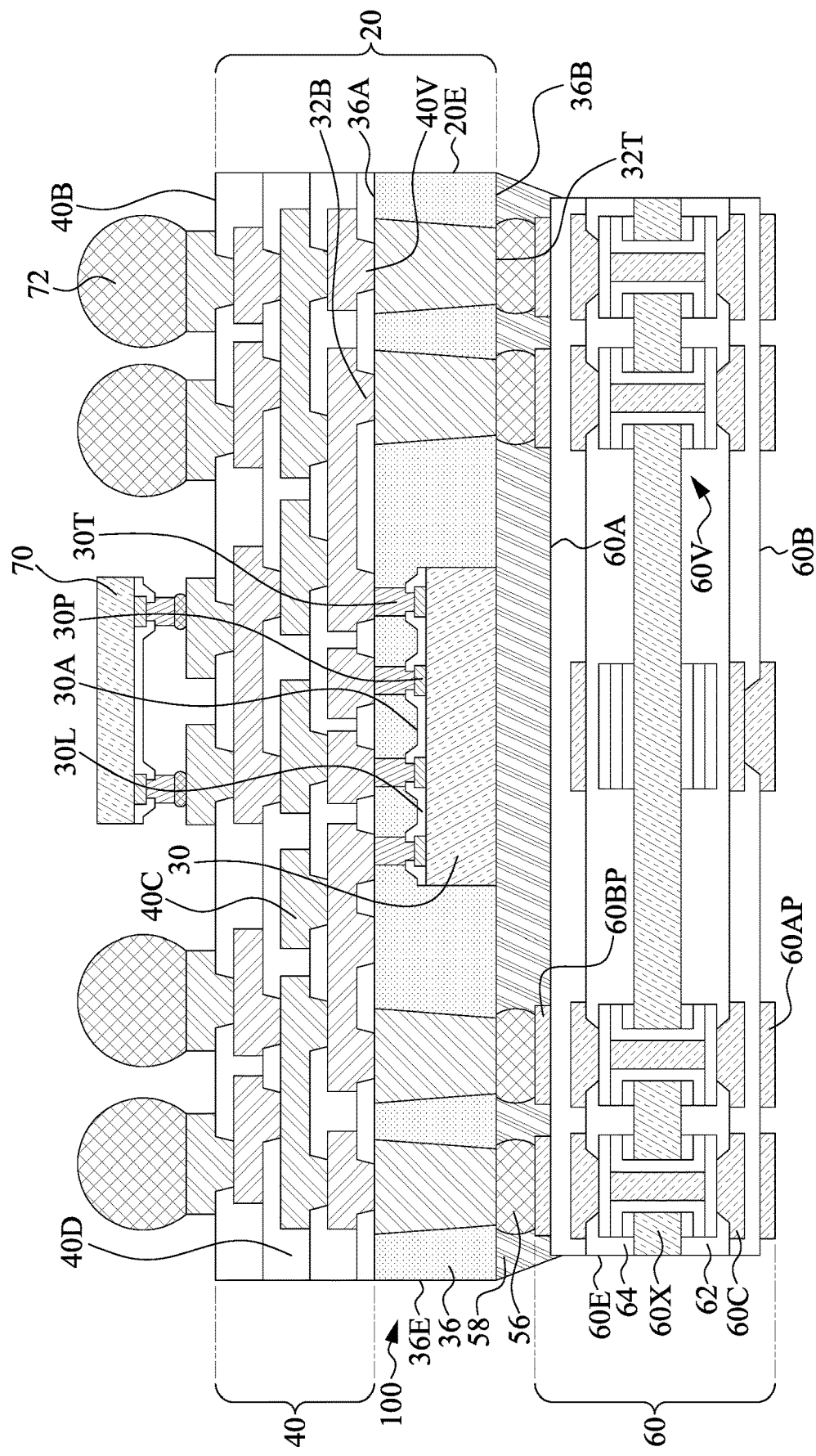
Figure 4F:
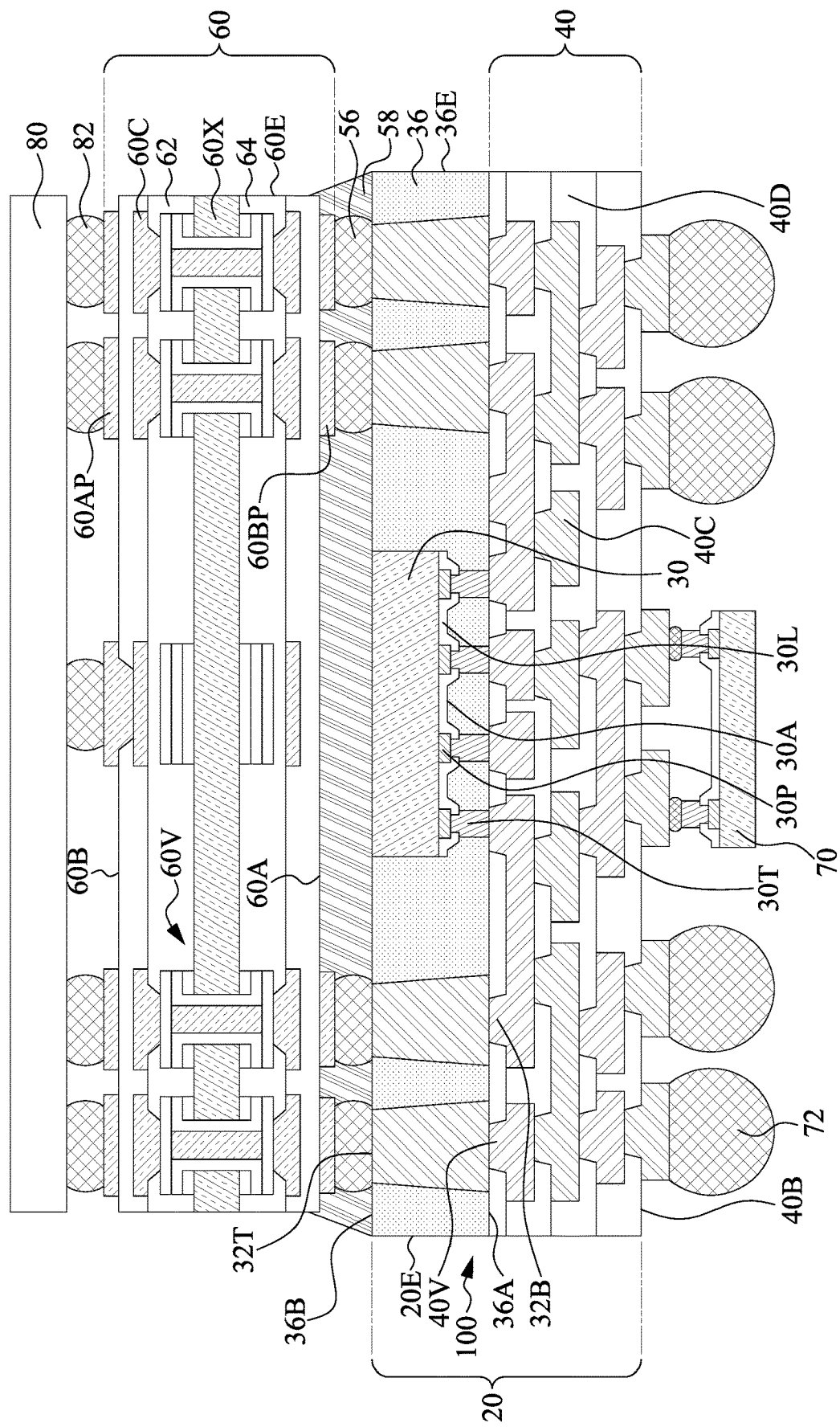

As shown in FIG. 4C, the encapsulated wafer 100 is singulated, and a circuit layer 60 is bonded on a second surface 36B of the singulated encapsulated wafer 100. In some embodiments, an underfill layer 58 is formed between the circuit layer 60 and the singulated encapsulated wafer 100. As shown in FIG. 4D, the singulated encapsulated wafer 100 is adhered to and supported by a tape 14, and the carrier 12 is released from the singulated encapsulated wafer 100. As shown in FIG. 4E, another electronic component 70 such as a passive device is bonded on the RDL 40. Conductors 72 such as solder conductors are formed on the RDL 40. As shown in FIG. 4F, a second die 80 such as a memory die is bonded to the circuit layer 60 through conductors 82.

FIG. 5A, FIG. 5B, FIG. 5C, FIG. 5D and FIG. 5E illustrate operations of manufacturing an electronic device package in accordance with some arrangements of the present disclosure.

Figure 5A:
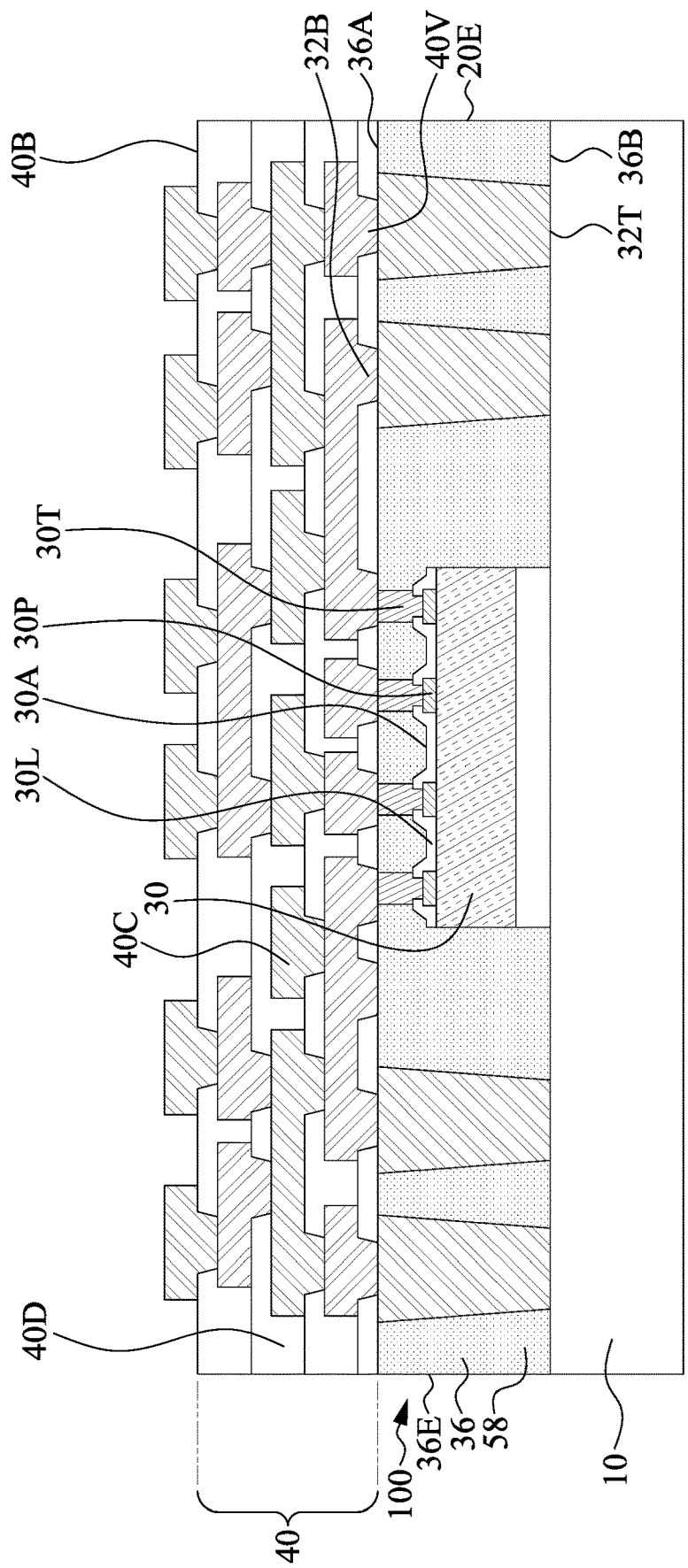
FIG. 5A, FIG. 5B, FIG. 5C, FIG. 5D and FIG. 5E illustrate operations of manufacturing an electronic device package in accordance with some arrangements of the present disclosure.

As shown in FIG. 5A, a buffer layer 54 is formed on the carrier 10, and the buffer layer 54 is patterned to form first openings 54H. Conductive pillars 32 are formed in the first openings 54H and on the buffer layer 54. A plurality of first dies (also referred to as semiconductor dies) 30 are reconstructed on the carrier 10, and adhered to the buffer layer 58 by a DAF 31. The first dies 30 are encapsulated by an encapsulation layer 36 to form an encapsulated wafer 100. The encapsulation layer 36 is then thinned by e.g., grinding to expose the conductive pillars 32 and the electrical terminals 30T such as conductive studs. An RDL 40 is formed on a first surface 36A of the encapsulated wafer 100.

Figure 5B:
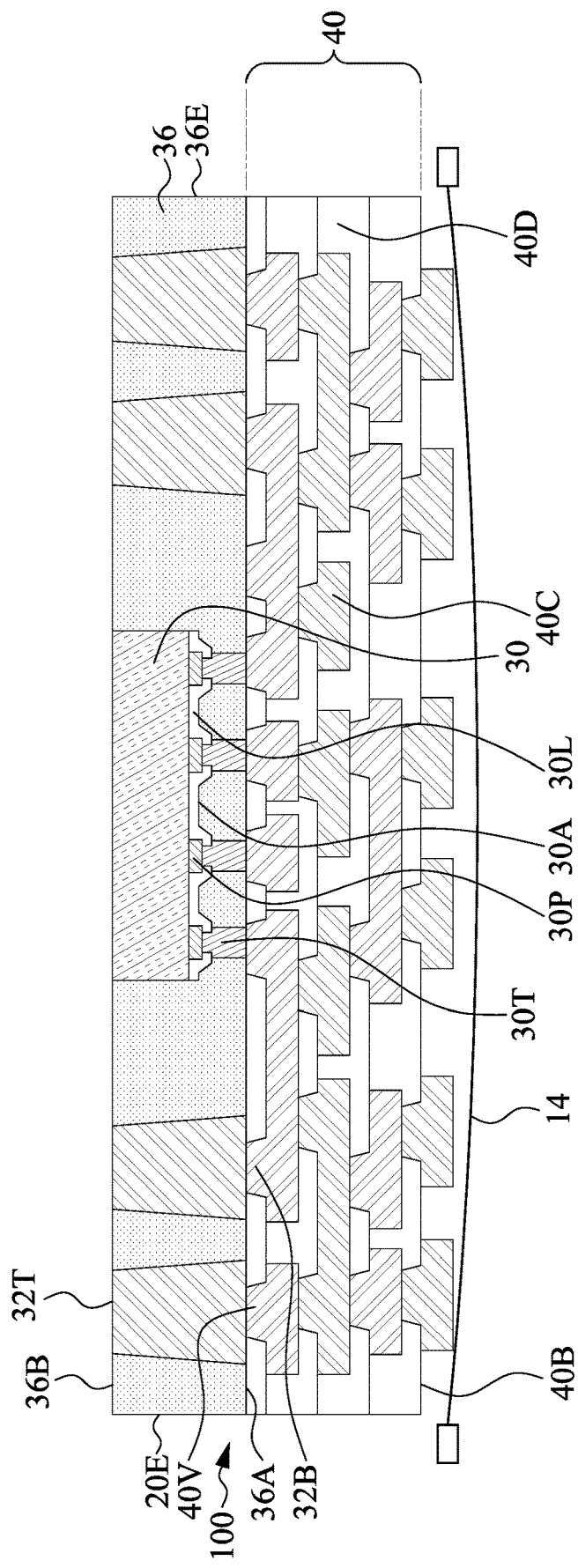

As shown in FIG. 5B, the RDL 40 is adhered to and supported by a tape 14, and the carrier 10 is released from the encapsulated wafer 100. The buffer layer 54 is removed from the encapsulated wafer 100 by, e.g., grinding. In some embodiments, the DAF 31 and a portion of the encapsulation layer 36 and the conductive pillars 32 in the first openings 54H are removed as well to expose the back surfaces 30B of the first dies 30.

Figure 5C:
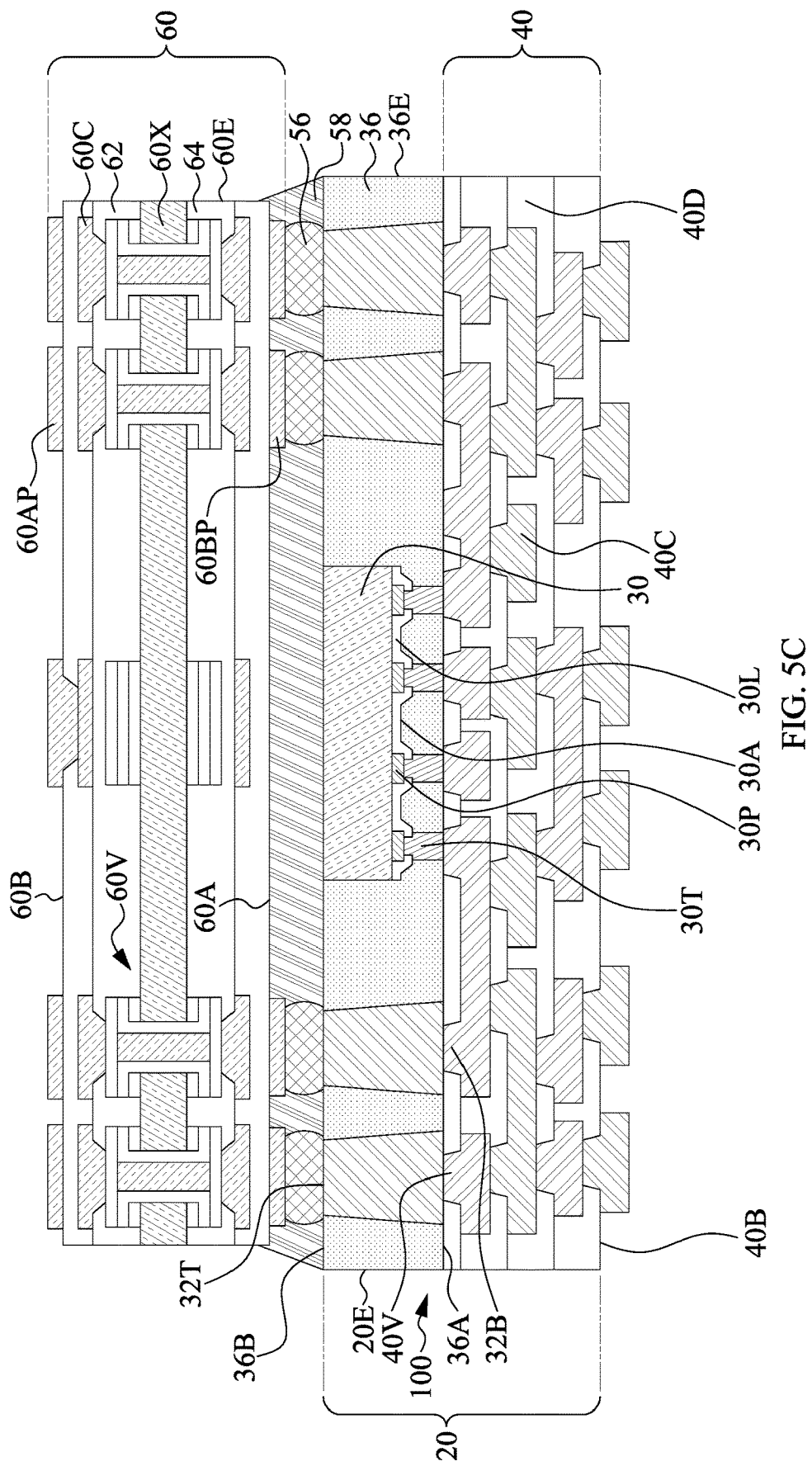
Figure 5D:
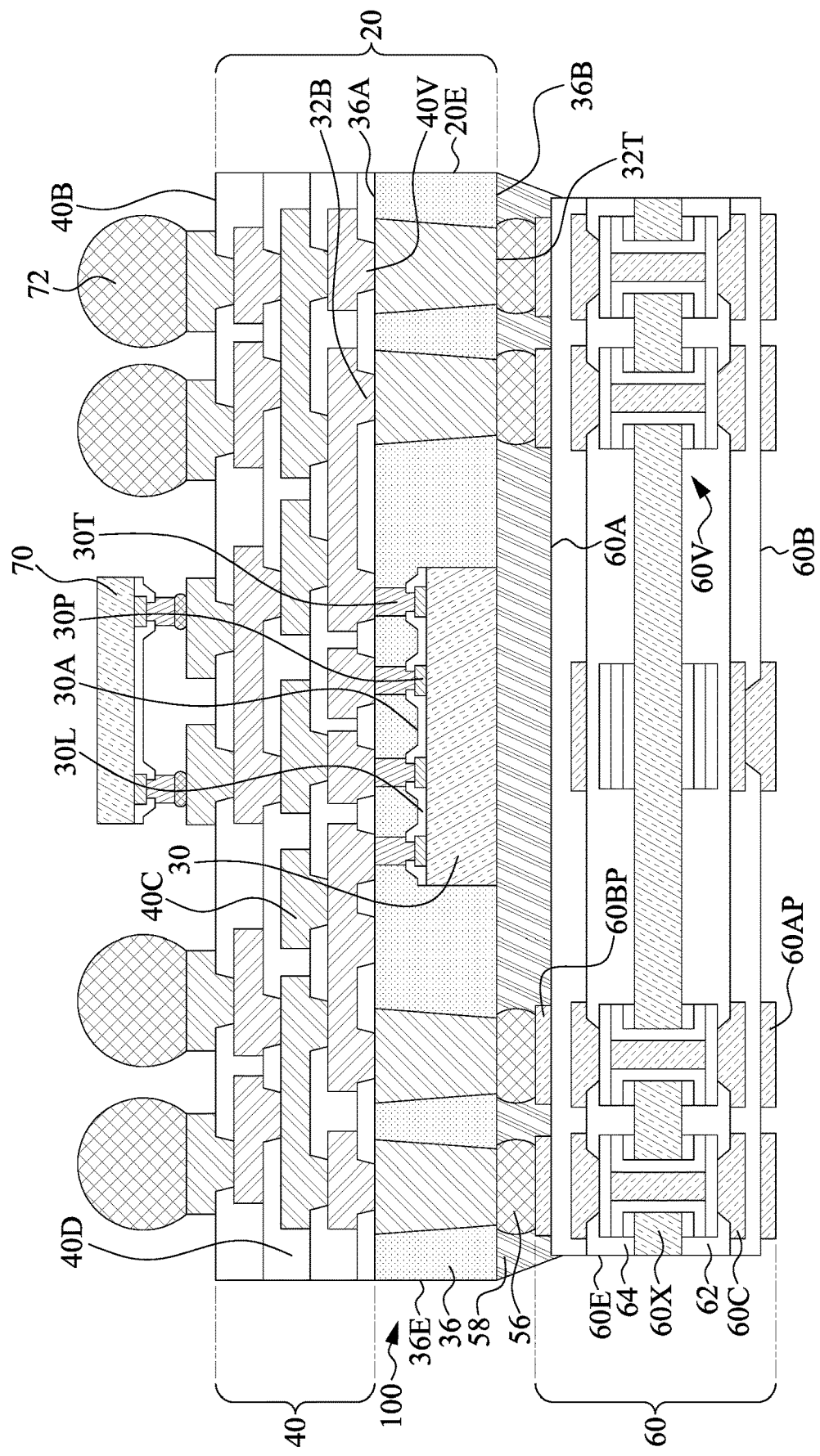
Figure 5E:
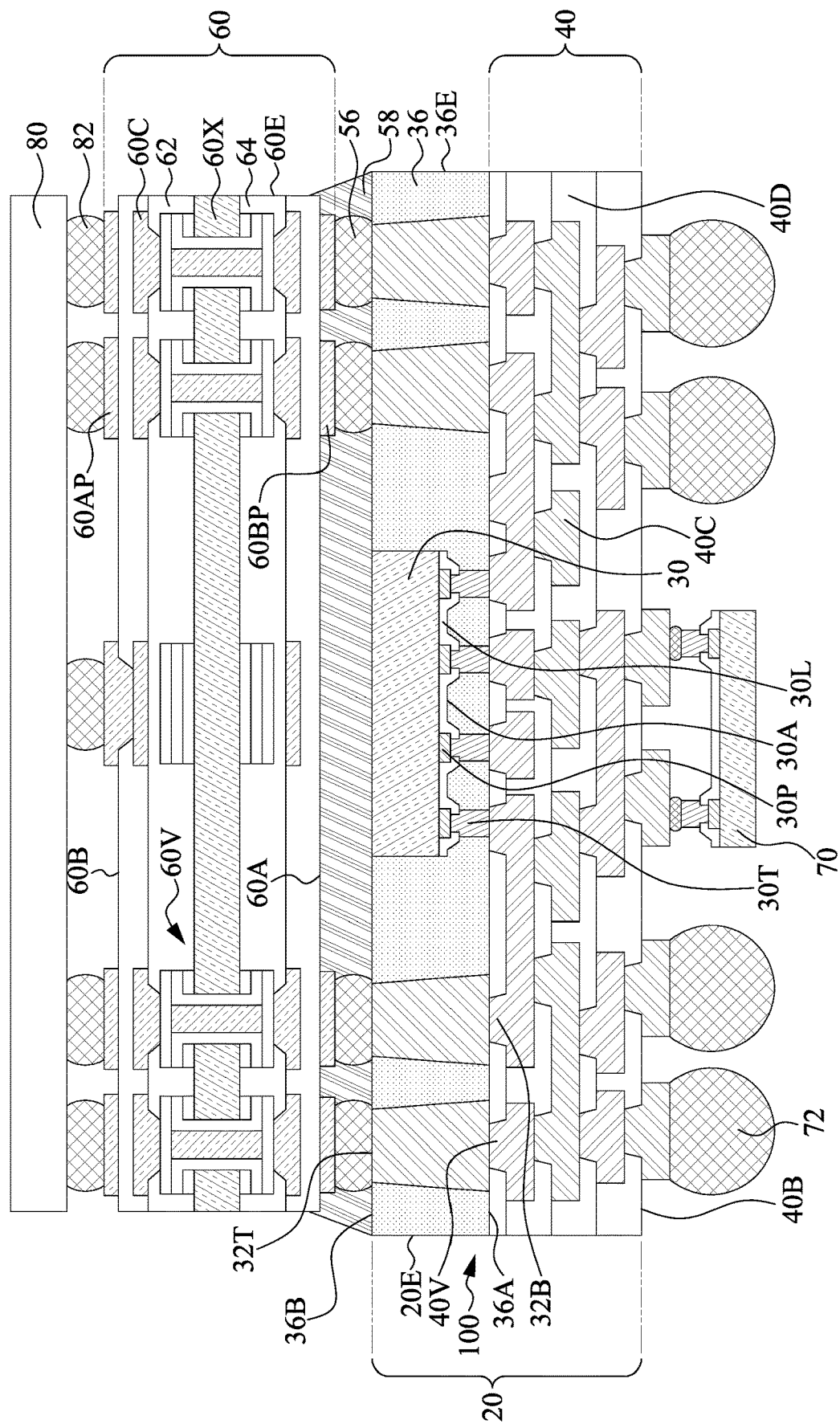

As shown in FIG. 5C, the encapsulated wafer 100 is singulated, and a circuit layer 60 is bonded on a second surface 36B of the singulated encapsulated wafer 100. In some embodiments, an underfill layer 58 is formed between the circuit layer 60 and the singulated encapsulated wafer 100. As shown in FIG. 5D, the tape 14 is released from the singulated encapsulated wafer 100. Another electronic component 70 is bonded on the RDL 40. Conductors 72 are formed on the RDL 40. As shown in FIG. 5E, a second die 80 such as a memory die is bonded to the circuit layer 60 through the conductors 82.

FIG. 6A, FIG. 6B, FIG. 6C and FIG. 6D illustrate operations of manufacturing an electronic device package in accordance with some arrangements of the present disclosure.

Figure 6A:
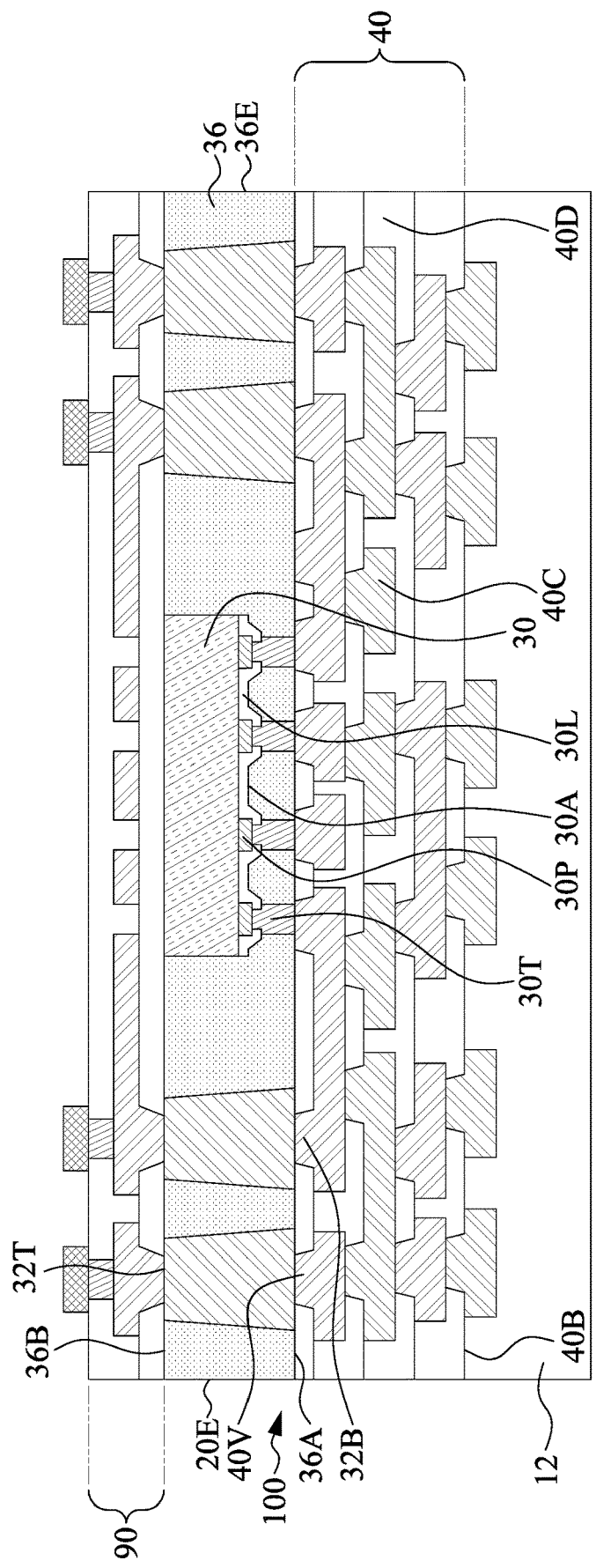
FIG. 6A, FIG. 6B, FIG. 6C and FIG. 6D illustrate operations of manufacturing an electronic device package in accordance with some arrangements of the present disclosure.

As shown in FIG. 6A, an encapsulated wafer 100 is formed in a manner similar to the manufacturing method disclosed in FIG. 4A-FIG. 4B. Prior to singulation, a second RDL 90 is formed on the second surface 36B of the encapsulation layer 36. The second RDL 90 is built up on the encapsulation layer 36, and electrically to the conductive pillars 32.

Figure 6B:
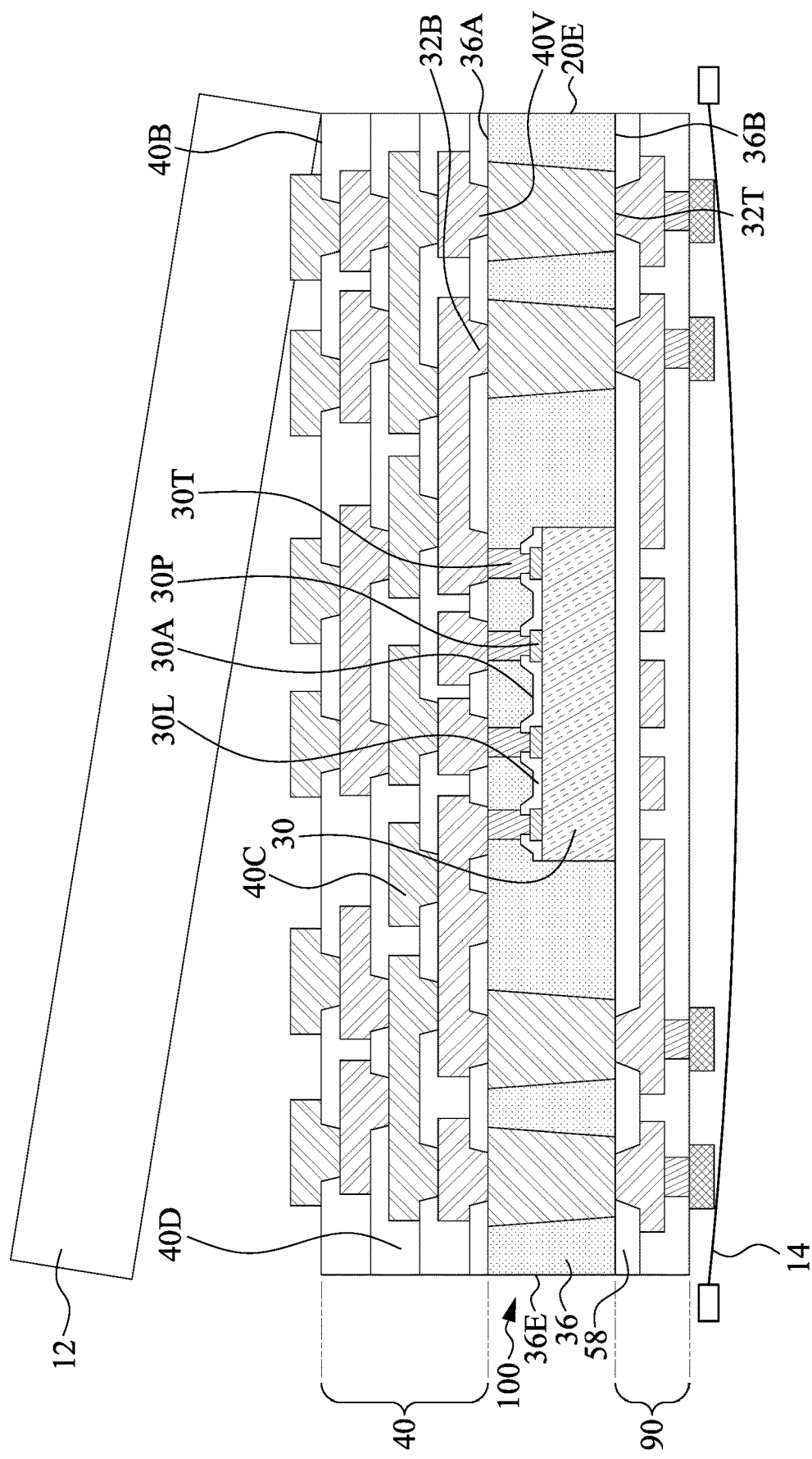
Figure 6C:
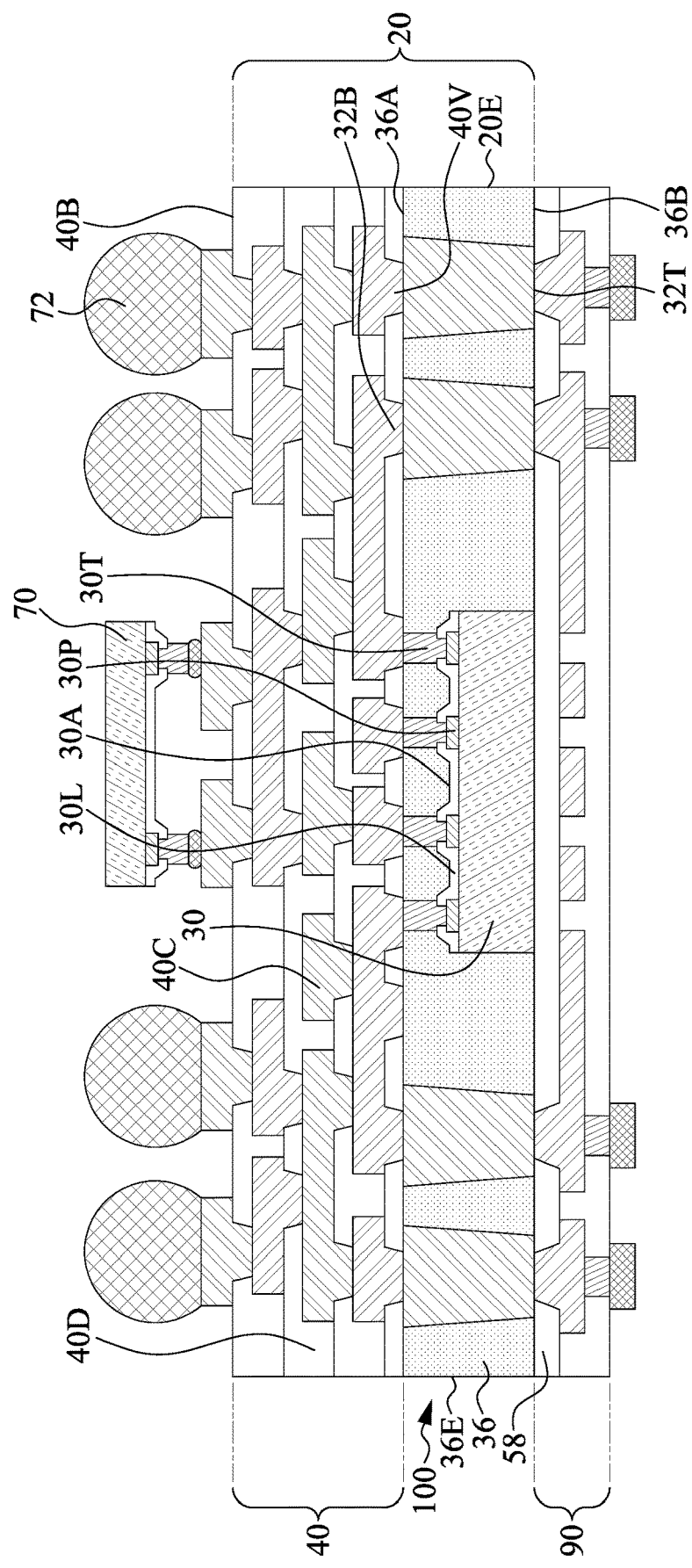
Figure 6D:
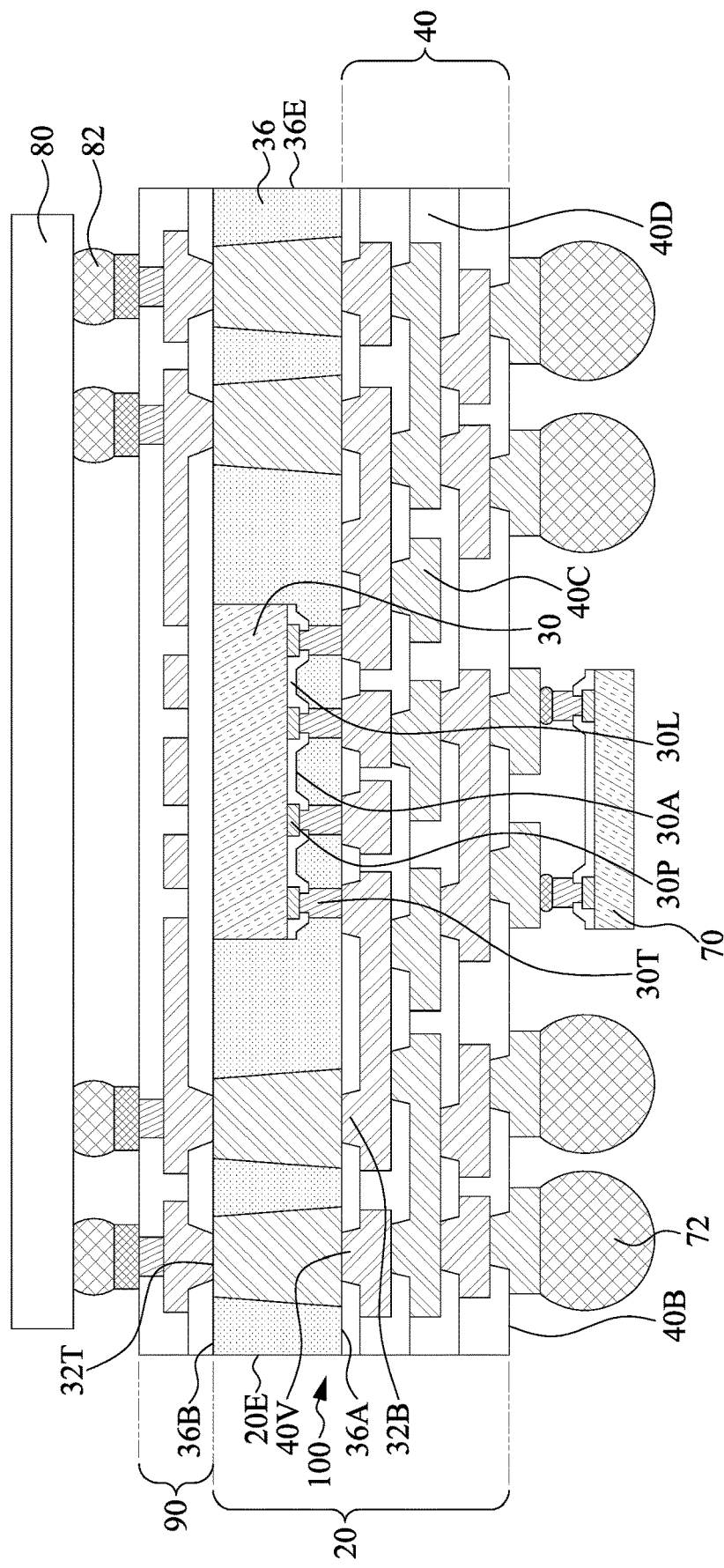

As shown in FIG. 6B, the encapsulated wafer 100 is adhered to and supported by a tape 14, and the carrier 12 is released from the encapsulated wafer 100. As shown in FIG. 6C, another electronic component 70 is bonded on the RDL 40. Conductors 72 are formed on the RDL 40. As shown in FIG. 6D, a second die 80 such as a memory die is bonded to the second RDL through the conductors 82.

In some embodiments of the present disclosure, the electronic device package includes a stack of circuit layers and an encapsulated electronic component interposed therebetween. The circuit layers disposed on opposite surfaces of the encapsulated electronic component are different circuit layers. By way of example, one of the circuit layers is an RDL, and the other one of the circuit layers is a circuit substrate. Accordingly, manufacturing costs can be reduced and warpage issue can be minimized. The encapsulated electronic component can be free of a die attach film (DAF), and thus delamination or bleeding issue between the DAF and the back surface of the semiconductor die can be avoided. Accordingly, the reliability and yield of can be improved.

In the description of some embodiments, a component provided or disposed "on" or "over" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

As used herein, the terms "approximately," "substantially," "substantial," "around" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device package, comprising:
an encapsulated electronic component, comprising:
  a redistribution layer (RDL); and
  an encapsulation layer including a first surface and a second surface opposite to the first surface, wherein the first surface is closer to the RDL than the second surface is;
a substrate disposed on the second surface of the encapsulation layer;
a conductor disposed between the substrate and the encapsulated electronic component, and electrically connecting the substrate to the encapsulated electronic component; and
a buffer layer disposed between the substrate and the encapsulated electronic component and around the conductor,
wherein the buffer layer includes a first opening for the conductor electrically connecting the encapsulated electronic component, and the first opening has a first aperture having a first width, and a second aperture having a second width, the first aperture is closer to the substrate than the second aperture is, and the second width is larger than the first width.

2. The electronic device package according to claim 1, wherein the RDL includes a second opening, and a conductive via disposed in the second opening, the second opening has a third aperture having a third width, and a fourth aperture having a fourth width, the third aperture is closer to the encapsulation layer than the fourth aperture is, and the fourth width is larger than the third width.

3. The electronic device package according to claim 1, wherein the encapsulated electronic component further comprises a conductive pillar, and a top surface of the conductive pillar is in the first opening and lower than a top surface of the buffer layer.

4. The electronic device package according to claim 3, wherein the conductor extends into the first opening to contact the top surface of the conductive pillar.

5. The electronic device package according to claim 3, further comprising a seed layer disposed between the conductive pillar and the buffer layer.

6. The electronic device package according to claim 5, wherein a portion of the seed layer is protruded with respect to of the top surface of the conductive pillar.

7. The electronic device package according to claim 1, wherein an edge of the buffer layer is substantially coplanar with an edge of the encapsulated electronic component.

8. The electronic device package according to claim 7, wherein a width of the substrate is smaller than a width of the encapsulated electronic component.

9. The electronic device package according to claim 8, further comprising an underfill layer disposed between the buffer layer and the substrate.

10. The electronic device package according to claim 1, wherein the buffer layer is disposed between the encapsulation layer and the conductor.

11. An electronic device package, comprising:
an encapsulated electronic component, comprising:
  a redistribution layer (RDL); and
  an encapsulation layer including a first surface and a second surface opposite to the first surface, wherein the first surface is closer to the RDL than the second surface is;
a substrate disposed on the second surface of the encapsulation layer;
a conductor disposed between the substrate and the encapsulated electronic component, and electrically connecting the substrate to the encapsulated electronic component; and
a buffer layer disposed between the substrate and the encapsulated electronic component and around the conductor,
wherein the encapsulated electronic component includes a semiconductor die, the semiconductor die includes a plurality of electric terminals, and surfaces of the electrical terminals are substantially coplanar with the first surface of the encapsulation layer.

12. An electronic device package, comprising:
an encapsulated electronic component, comprising:
  a redistribution layer (RDL); and
  an encapsulation layer including a first surface and a second surface opposite to the first surface, wherein the first surface is closer to the RDL than the second surface is;
a substrate disposed on the second surface of the encapsulation layer;
a conductor disposed between the substrate and the encapsulated electronic component, and electrically connecting the substrate to the encapsulated electronic component; and
a buffer layer disposed between the substrate and the encapsulated electronic component and around the conductor,
wherein a line width/spacing (L/S) of a circuit layer of the substrate is larger than an L/S of a circuit layer of the RDL.

13. An electronic device package, comprising:
an encapsulated electronic component, comprising:
  a redistribution layer (RDL); and
  an encapsulation layer including a first surface and a second surface opposite to the first surface, wherein the first surface is closer to the RDL than the second surface is;
a substrate disposed on the second surface of the encapsulation layer;
a conductor disposed between the substrate and the encapsulated electronic component, and electrically connecting the substrate to the encapsulated electronic component; and a buffer layer disposed between the substrate and the encapsulated electronic component and around the conductor, wherein the substrate comprises a rolled and annealed (RA) copper circuit layer, and the RDL comprises an electroplated copper circuit layer.

14. A method of manufacturing an electronic device package, comprising:

forming a buffer layer on a carrier;

reconstructing first dies on the carrier, and encapsulating the first dies to form an encapsulated wafer, wherein forming the buffer layer on the carrier is prior to reconstructing the first dies on the carrier;

forming a redistribution layer (RDL) on a first surface of the encapsulated wafer;

bonding a circuit layer on a second surface, which is opposite to the first surface, of the encapsulated wafer; and bonding a second die on the circuit layer.

15. The method according to claim 14, wherein the first dies are reconstructed on the carrier with die attach films (DAFs), and the method further comprises releasing the carrier from the encapsulated wafer and removing the DAFs from the encapsulated wafer prior to bonding the circuit layer on the second surface of the encapsulated wafer.

* * * * *